(12) United States Patent
Ohki

(10) Patent No.: US 8,883,581 B2
(45) Date of Patent: Nov. 11, 2014

(54) COMPOUND SEMICONDUCTOR DEVICE AND METHOD FOR MANUFACTURING THE SAME

(71) Applicant: Transphorm Japan, Inc., Kanagawa (JP)

(72) Inventor: Toshihiro Ohki, Hadano (JP)

(73) Assignee: Transphorm Japan, Inc., Yokohama (JP)

( * ) Notice: Subject to any disclaimer, the term of this patent is extended or adjusted under 35 U.S.C. 154(b) by 116 days.

(21) Appl. No.: 13/771,413

(22) Filed: Feb. 20, 2013

(65) Prior Publication Data

US 2013/0256685 A1 Oct. 3, 2013

(30) Foreign Application Priority Data

Mar. 30, 2012 (JP) ................................. 2012-081975

(51) Int. Cl.
| | | |
|---|---|---|
| *H01L 21/338* | (2006.01) | |
| *H01L 29/778* | (2006.01) | |
| *H01L 21/02* | (2006.01) | |
| *H01L 29/66* | (2006.01) | |
| *H01L 29/10* | (2006.01) | |
| *H01L 29/20* | (2006.01) | |

(52) U.S. Cl.
CPC ........ *H01L 29/778* (2013.01); *H01L 21/02365* (2013.01); *H01L 29/66462* (2013.01); *H01L 29/7787* (2013.01); *H01L 29/1029* (2013.01); *H01L 29/2003* (2013.01); *H01L 21/0254* (2013.01); *H01L 21/02576* (2013.01); *H01L 21/02579* (2013.01); *H01L 21/0262* (2013.01)
USPC ............................................ 438/172; 257/76

(58) Field of Classification Search
USPC ............................................ 438/172; 257/76
See application file for complete search history.

(56) References Cited

U.S. PATENT DOCUMENTS

| 3,287,611 | A | * | 11/1966 | Bockemuehl et al. | ........... 257/76 |
| 4,792,832 | A | * | 12/1988 | Baba et al. | ........................ 257/22 |
| 4,805,005 | A | * | 2/1989 | Usagawa et al. | ............... 257/194 |
| 2006/0197107 | A1 | * | 9/2006 | Kanamura et al. | ............ 257/194 |
| 2008/0157121 | A1 | * | 7/2008 | Ohki | .............................. 257/194 |

(Continued)

FOREIGN PATENT DOCUMENTS

| JP | S61-84869 | 4/1986 |
| JP | H7-93428 | 10/1995 |
| JP | 2004-342810 A1 | 12/2004 |
| JP | 2008-112868 A1 | 5/2008 |

OTHER PUBLICATIONS

Hirose, Mayumi "Numerical analysis of short-gate GaN HEMTs with Fe-doped buffer layers" Phys. Status Solidi C 9, No. 2 pp. 362-364 published online Nov. 18, 2011.*

(Continued)

*Primary Examiner* — Yu-Hsi D Sun
*Assistant Examiner* — Grant Withers
(74) *Attorney, Agent, or Firm* — Fish & Richardson P.C.

(57) ABSTRACT

A compound semiconductor device includes a compound semiconductor composite structure in which two-dimensional electron gas is generated; and an electrode that is formed on the compound semiconductor composite structure, wherein the compound semiconductor composite structure includes a p-type semiconductor layer below a portion where the two-dimensional electron gas is generated, and the p-type semiconductor layer includes a portion containing a larger amount of an ionized acceptor than other portions of the p-type semiconductor layer, the portion being located below the electrode.

19 Claims, 26 Drawing Sheets

(56) References Cited

U.S. PATENT DOCUMENTS

| | | | |
|---|---|---|---|
| 2011/0068370 A1* | 3/2011 | Kim et al. | 257/194 |
| 2011/0186859 A1* | 8/2011 | Ohki | 257/76 |
| 2011/0220965 A1* | 9/2011 | Ohki | 257/194 |
| 2011/0318892 A1* | 12/2011 | Ohki | 438/172 |
| 2012/0043550 A1* | 2/2012 | Ito et al. | 257/76 |
| 2012/0074426 A1* | 3/2012 | Ohki et al. | 257/76 |
| 2012/0091522 A1* | 4/2012 | Ozaki et al. | 257/330 |
| 2012/0138944 A1* | 6/2012 | Kanamura et al. | 257/66 |
| 2012/0138948 A1* | 6/2012 | Miyajima et al. | 257/76 |
| 2012/0139630 A1* | 6/2012 | Ozaki et al. | 330/250 |
| 2012/0146046 A1* | 6/2012 | Ohki et al. | 257/76 |
| 2012/0146097 A1* | 6/2012 | Endo et al. | 257/194 |
| 2012/0149161 A1* | 6/2012 | Ohki et al. | 438/270 |
| 2012/0205662 A1* | 8/2012 | Nakamura et al. | 257/76 |
| 2012/0217507 A1* | 8/2012 | Ohki | 257/76 |
| 2012/0217543 A1* | 8/2012 | Minoura et al. | 257/190 |
| 2012/0217544 A1* | 8/2012 | Ohki | 257/194 |
| 2013/0075789 A1* | 3/2013 | Kanamura et al. | 257/194 |
| 2013/0082307 A1* | 4/2013 | Okamoto et al. | 257/279 |
| 2013/0082400 A1* | 4/2013 | Ohki et al. | 257/774 |
| 2013/0083568 A1* | 4/2013 | Makiyama et al. | 363/37 |
| 2013/0083569 A1* | 4/2013 | Minoura et al. | 363/37 |
| 2013/0087804 A1* | 4/2013 | Yao et al. | 257/76 |
| 2013/0105810 A1* | 5/2013 | Nishimori et al. | 257/76 |
| 2013/0228795 A1* | 9/2013 | Ohki et al. | 257/76 |
| 2013/0256685 A1* | 10/2013 | Ohki | 257/76 |
| 2013/0256690 A1* | 10/2013 | Nakamura et al. | 257/76 |
| 2013/0256695 A1* | 10/2013 | Bridger et al. | 257/76 |
| 2014/0084339 A1* | 3/2014 | Nishimori et al. | 257/183 |
| 2014/0084345 A1* | 3/2014 | Ohki et al. | 257/194 |
| 2014/0106527 A1* | 4/2014 | Kamada | 438/270 |
| 2014/0151748 A1* | 6/2014 | Nishimori et al. | 257/194 |
| 2014/0197460 A1* | 7/2014 | Makiyama | 257/194 |
| 2014/0206158 A1* | 7/2014 | Yamada | 438/172 |
| 2014/0209920 A1* | 7/2014 | Liu et al. | 257/76 |

OTHER PUBLICATIONS

Van Zeghbroeck, Bart "Principles of Semiconductor Devices" chapter 2.7 about Doped Semiconductors available online as of Apr. 6, 2009 at ecee.colorado.edu/~bart/book.*

Notice of Preliminary Rejection in Korean Application No. 10-2013-0025106, mailed Jul. 30, 2014, 3 pages.

* cited by examiner

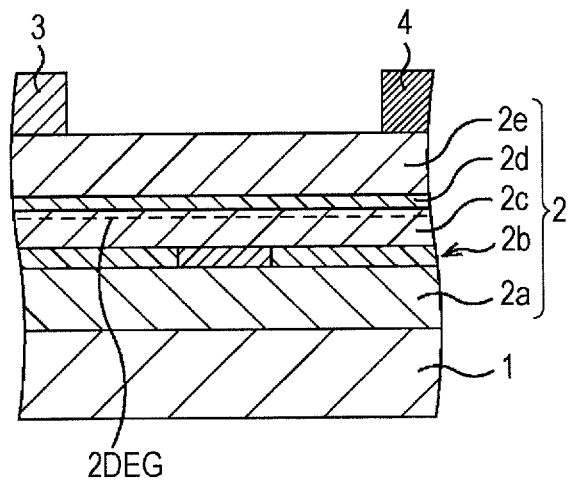
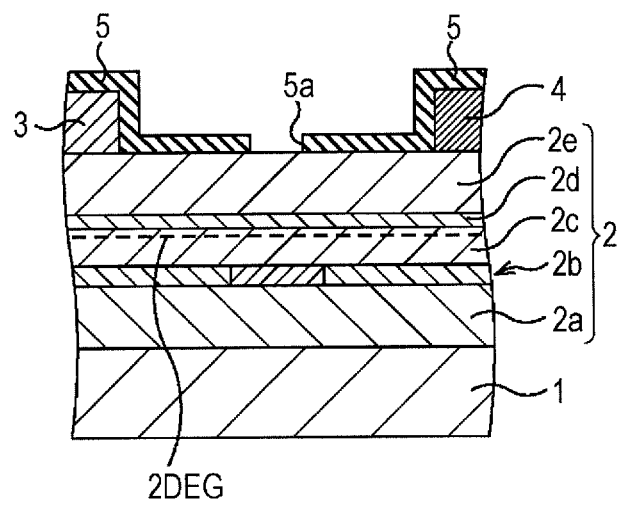
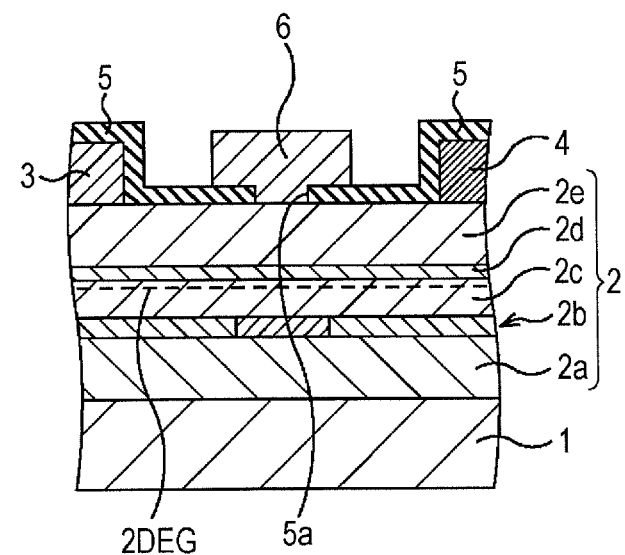

US 8,883,581 B2

COMPOUND SEMICONDUCTOR DEVICE AND METHOD FOR MANUFACTURING THE SAME

CROSS-REFERENCE TO RELATED APPLICATION(S)

This application is based upon and claims the benefit of priority of the prior Japanese Patent Application No. 2012-081975, filed on Mar. 30, 2012, the entire contents of which are incorporated herein by reference.

FIELD

Embodiments discussed herein relate to a compound semiconductor device and a method for manufacturing the compound semiconductor device.

BACKGROUND

Nitride semiconductor devices featuring high saturated electron velocities and wide band gaps have been actively developed as semiconductor devices of high voltage resistance and high output. A large number of reports have been made regarding nitride semiconductor devices such as field effect transistors, in particular, high electron mobility transistors (HEMTs). AlGaN/GaN HEMTs that use GaN in the electron transit layer and AlGaN in the electron donating layer are drawing much attention. According to AlGaN/GaN HEMT, strain attributable to the difference in lattice constant between GaN and AlGaN occurs in AlGaN. Piezoelectric polarization caused by the strain and spontaneous polarization of AlGaN generate high-concentration two-dimensional electron gas (2DEG). Thus, high voltage resistance and high output are realized.

Japanese Examined Patent Application Publication No. 7-093428 and Japanese Laid-open Patent Publication No. 2008-112868 are examples of related art.

SUMMARY

According to an aspect of the invention, a compound semiconductor device includes a compound semiconductor composite structure in which two-dimensional electron gas is generated; and an electrode that is formed on the compound semiconductor composite structure, wherein the compound semiconductor composite structure includes a p-type semiconductor layer below a portion where the two-dimensional electron gas is generated, and the p-type semiconductor layer includes a portion containing a larger amount of an ionized acceptor than other portions of the p-type semiconductor layer, the portion being located below the electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A to 2C are schematic cross-sectional views that sequentially illustrate the steps of the method for manufacturing the AlGaN/GaN HEMT according to the first embodiment following the steps illustrated in FIGS. 1A to 1C;

DESCRIPTION OF EMBODIMENTS

Figure 1A:
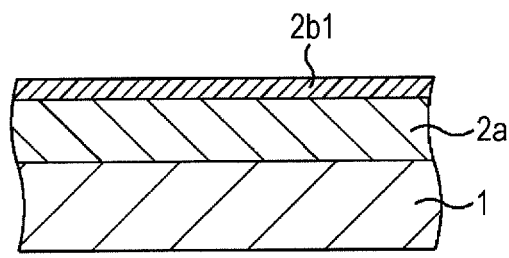
FIGS. 1A to 1C are schematic cross-sectional views that sequentially illustrate the steps of a method for manufacturing an AlGaN/GaN HEMT according to a first embodiment.

Embodiments will now be described with reference to the drawings. In the embodiments described below, the structures of compound semiconductor devices and the methods for manufacturing the compound semiconductor devices are both described.

In the drawings referred to in the description below, the size and thickness of some constitutional components may not be relatively illustrated accurately for the sake of convenience.

First, problems that typical nitride semiconductor devices face are discussed.

In the cases where nitride semiconductor devices are used in power applications, the devices are desirably of a normally off mode in order for the devices to be compatible with existing systems and from the viewpoint of safe operation. However, for example, electron transit layers of AlGaN/GaN HEMTs have a very high electron concentration due to actions of strong piezoelectric polarization and spontaneous polarization and thus it is relatively difficult to form normally off AlGaN/GaN HEMTs. Presently, various techniques have been studied to make normally off devices. For example, various structures have been proposed such as a gate recess structure in which a gate electrode is formed so as to fill a recess formed in a compound semiconductor layer and a p-GaN cap structure in which a p-GaN layer is formed between the compound semiconductor layer and the gate electrode. Among these, a p-GaN cap structure is considered to be suitable for making normally off devices since the shift in threshold in the positive direction is large because of the p-type semiconductor layer that has an ability to lift the energy band.

However, in a p-GaN cap structure, the presence of the p-GaN layer increases the distance between the gate electrode and the portion in which 2DEG is formed. Thus, problems arise such as deterioration of pinch off characteristics and a decrease in gm. Moreover, in order to ensure the electrical conductivity in the horizontal direction, parts of the p-GaN layer not located directly below the gate electrode are removed. Due to etching damage inflicted by the removal, deterioration of characteristics caused by traps such as current collapse has become a problem.

The above-described problems are solved by compound semiconductor devices described as embodiments below. The compound semiconductor devices achieve a highly reliable normally off characteristic and a high gm characteristic without deterioration of characteristics caused by traps such as current collapse First Embodiment In a first embodiment, a Schottky-type AlGaN/GaN HEMT is described as an example of the compound semiconductor device.

FIGS. 1A to 2C are schematic cross-sectional views that sequentially illustrate the steps of a method for manufacturing an AlGaN/GaN HEMT of the first embodiment.

First, as illustrated in FIG. 1A, a semi-insulating SiC substrate 1 is used as a substrate for growing semiconductor layers of the HEMT. An i (intentionally undoped)-GaN layer 2a and a p-GaN layer that forms a p-GaN portion 2b1 are sequentially formed on the SiC substrate 1.

The substrate for growing the semiconductor layers of the HEMT may be a Si substrate, a sapphire substrate, a GaAs substrate, a GaN substrate, or the like instead of the SiC substrate. The substrate may be semi-insulating or electrically conductive.

The i-GaN layer 2a and the p-GaN layer that forms the p-GaN portion 2b1 are sequentially grown on the SiC substrate 1 by, for example, a metal organic vapor phase epitaxy (MOVPE) method. A molecular beam epitaxy (MBE) method may be employed instead of the MOVPE method.

The i-GaN layer 2a is formed by growing i-GaN to a thickness of about 3 μm, for example. The p-GaN layer that forms the p-GaN portion 2b1 is formed by growing p-GaN to a thickness of about 50 nm.

A mixed gas of a trimethyl gallium (TMGa) gas which is a Ga source and an ammonia ($NH_3$) gas is used as a source gas for growing GaN. The flow rate of the TMGa gas is appropriately set and the flow rate of the $NH_3$ gas is set to about 100 sccm to 10 slm. The growth pressure is about 50 Torr to 300 Torr and the growth temperature is about 1000° C. to 1200° C.

In growing p-type GaN, in other words, in forming a p-GaN layer that forms the p-GaN portion 2b1, a p-type impurity, Mg, C, Zn, or the like is added to the source gas of GaN. For example, Mg is added to the source gas. In this example, a Cp2Mg gas containing Mg is added to the source gas at a particular flow rate so as to dope GaN with Mg. The Mg dopant concentration is about $1 \times 10^{16}/cm^3$ to about $1 \times 10^{21}/cm^3$, e.g., about $1 \times 10^{19}/cm^3$.

After the p-GaN layer is formed, the p-GaN layer is heat-treated at about 400° C. to 1200° C., for example, at about 800° C. to activate the p-type impurity, Mg.

Figure 1B:
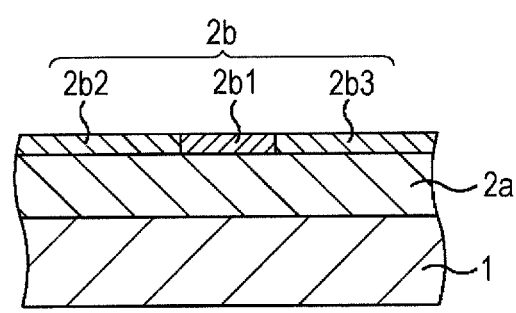

Next, as illustrated in FIG. 1B, a back barrier layer 2b is formed.

First, a resist is applied to the p-GaN layer and lithographically processed. As a result, a resist mask that covers a portion in the p-GaN layer (the portion that will form the p-GaN portion 2b1) aligned with and below the position where a gate electrode is to be formed and that leaves the rest uncovered is formed.

An impurity, such as argon (Ar), that deactivates the p-type impurity of p-GaN is ion-implanted through the resist mask at an acceleration energy of 15 keV and a dose of $1 \times 10^{14}/cm^2$.

The impurity that deactivates the p-type impurity may be boron (B), oxygen (O), phosphorus (P), iron (Fe), or the like instead of Ar. This ion implantation deactivates all parts of the p-GaN layer except in the position where the gate electrode is to be formed and produces p⁻-GaN to thereby make p⁻-GaN portions 2b2 and 2b3. The ionized acceptor concentration in the p⁻-GaN portions 2b2 and 2b3 is lower than that of the p-GaN portion 2b1. The resist mask is removed by an ashing process or a wet process that uses a particular chemical solution.

A back barrier layer 2b that includes the p-GaN portion 2b1 formed in the portion aligned with and below the position where the gate electrode is to be formed and the p⁻-GaN portions 2b2 and 2b3 formed on either side of the p-GaN portion 2b1 is thereby formed through the processes described above. In the back barrier layer 2b, the p-GaN portion 2b1 contains a larger amount of ionized acceptor than the p⁻-GaN portions 2b2 and 2b3 in a unit area. That is, the p-GaN portion 2b1 is a portion with a high ionized acceptor concentration.

Figure 1C:
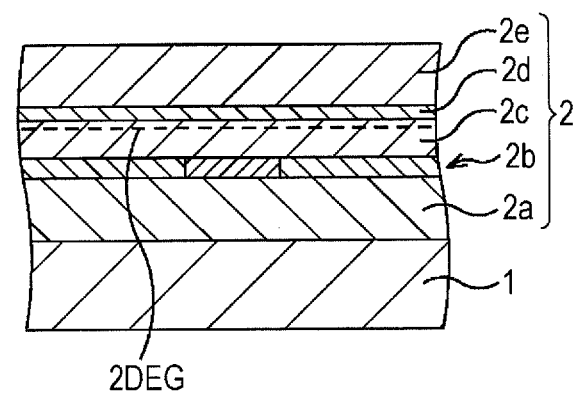

Next, as illustrated in FIG. 1C, an electron transit layer 2c, an intermediate layer 2d, and an electron donating layer 2e are sequentially formed on the back barrier layer 2b.

Compound semiconductors that respectively form the electron transit layer 2c, the intermediate layer 2d, and the electron donating layer 2e are sequentially grown on the back barrier layer 2b by a MOVPE method. The electron transit layer 2c is formed by growing i-GaN to a thickness of about 100 nm. The intermediate layer 2d is formed by growing i-AlGaN to a thickness of about 5 nm. The electron donating layer 2e is formed by growing n-AlGaN to a thickness of about 30 nm. The intermediate layer 2d may sometimes be omitted. The electron donating layer 2e may be formed of i-AlGaN.

A mixed gas of a trimethyl gallium (TMGa) gas which is a Ga source and an ammonia ($NH_3$) gas is used as a source gas for growing GaN. A mixed gas of a TMAl gas, a TMGa gas, and an $NH_3$ gas is used as a source gas for growing AlGaN. Whether to supply TMAl gas or TMGa gas and the flow rate thereof are appropriately set in accordance with the compound semiconductor layer to be grown. The flow rate of the $NH_3$ gas, which is a common material, is about 100 sccm to 10 slm. The growth pressure is about 50 Torr to 300 Torr and the growth temperature is about 1000° C. to 1200° C.

In growing n-type AlGaN, for example, in forming the electron donating layer 2e (n-AlGaN), an n-type impurity is added to the source gas of AlGaN. In this example, a silane ($SiH_4$) gas containing Si is added to the source gas at a particular flow rate, for example, so as to dope AlGaN with Si. The Si dopant concentration is about $1\times10^{18}$/cm³ to about $1\times10^{20}$/cm³, for example, about $5\times10^{18}$/cm³.

As a result, a compound semiconductor composite structure 2 including the sequentially stacked i-GaN layer 2a, back barrier layer 2b, electron transit layer 2c, intermediate layer 2d, and electron donating layer 2e is formed.

Next, an element isolation structure is formed. In particular, argon (Ar) is implanted in an element isolation region of the compound semiconductor composite structure 2, for example. As a result, an element isolation structure is formed in the compound semiconductor composite structure 2 and a surface layer portion of the SiC substrate 1. The element isolation structure defines the active region in the compound semiconductor composite structure 2.

The element isolation may be conducted through a shallow trench isolation method, for example, instead of the implantation method.

Next, as illustrated in FIG. 2A, a source electrode 3 and a drain electrode 4 are formed.

Ta/Al (Ta in the lower layer and Al in the upper layer) is used as an electrode material. In forming the electrodes, an overhang structure double layer resist suitable for a vapor deposition method or a lift-off method is used, for example. The resist is applied to the compound semiconductor composite structure 2 and a resist mask having openings at positions where the source electrode and the drain electrode are to be formed is formed. Then Ta/Al is deposited by, for example, a vapor deposition method, through the resist mask. The thickness of Ta is about 20 nm and the thickness of Al is about 200 nm. The overhang structure resist mask and Ta/Al deposited on the resist mask are removed by a lift-off method. Then the SiC substrate 1 is heat-treated in, for example, a nitrogen atmosphere at 400° C. to 1000° C., for example, at about 550° C., so as to cause the remaining Ta/Al to be in ohmic contact with the electron donating layer 2e. In the cases where the Ta/Al and the electron donating layer 2e are in ohmic contact with each other without conducting heat treatment, the heat treatment may be omitted. As a result, the source electrode 3 and the drain electrode 4 each constituted by Ta/Al are formed.

Next, as illustrated in FIG. 2B, a protective film 5 that has an opening 5a is formed on the surface of the compound semiconductor composite structure 2.

In particular, first, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like to form a protective film 5.

Next, a resist is applied over the entire surface of the protective film 5 and lithographically processed. As a result, a resist mask having an opening that exposes the position in the protective film 5 where the gate electrode is to be formed is formed.

The protective film 5 is dry-etched through the resist mask by using, for example, a fluorine-based gas as the etching gas. As a result, the opening 5a is formed at the position in the protective film 5 where the gate electrode is to be formed. The resist mask is removed by an ashing process or a wet process that uses a particular chemical solution.

Next, referring to FIG. 2C, a gate electrode 6 is formed.

Ni/Au (Ni in the lower layer and Au in the upper layer) is used as an electrode material. In forming the electrode, an overhang structure double layer resist suitable for a vapor deposition method or a lift-off method is used, for example. The resist is applied to the protective film 5 and in the opening 5a and a resist mask that has an opening that exposes the position where the gate electrode is to be formed as well as the opening 5a is formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 that makes Schottky contact with the surface of the compound semiconductor composite structure 2 and fills the interior of the opening 5a with the gate metal is formed. The gate electrode 6 is formed to have an overhang shape constituted by Ni that fills the interior of the opening 5a and extends over the protective film 5 and Au deposited on Ni.

Then electrical connection and the like are established among the source electrode 3, the drain electrode 4, and the gate electrode 6 so as to form a Schottky-type AlGaN/GaN HEMT.

According to the AlGaN/GaN HEMT of this embodiment, the back barrier layer 2b is formed below the portion of the compound semiconductor composite structure 2 where the 2DEG is generated. Because of the p-GaN portion 2b1 having a relatively high ionized acceptor concentration in the back barrier layer 2b, a normally off mode is reliably realized. Moreover, since the position where the back barrier layer 2b is formed is below the portion where 2DEG is generated, the distance between the gate electrode 6 and 2DEG is short and gm is improved. Since the surface of the compound semiconductor composite structure 2 is not dry etched, no etching damage occurs. Accordingly, the phenomenon (current collapse etc.) induced trapping caused by etching damage is suppressed.

The back barrier layer 2b includes the p⁻-GaN portions 2b2 and 2b3 on either side of the p-GaN portion 2b1. According to a typical p-GaN cap structure, i.e., a structure in which p-GaN is embedded directly below the channel so as to form a concentration gradient in a horizontal direction, a process of re-growth is performed and a regrowth interface is generated. This interface is often exposed to the atmosphere outside the crystal growth system and causes various defects. During high-voltage operation of the device, these defects form leak paths, and there is a risk that the leak current may increase when power is switched off. In this embodiment, the p⁻-GaN portions 2b2 and 2b3 that are aligned below the spaces between electrodes (i.e., at positions other than that directly below the gate electrode 6, for example, a position between the source electrode 3 and the gate electrode 6 and a position between the gate electrode 6 and the drain electrode 4) are present. Thus, the semiconductor layer containing leak paths becomes depleted in regions in contact with the p⁻-GaN portions 2b2 and 2b3 and the electrons are excluded. Accordingly, the number of leak paths at the re-growth interface is reduced and satisfactory pinch-off characteristics can be obtained.

Figure 3:
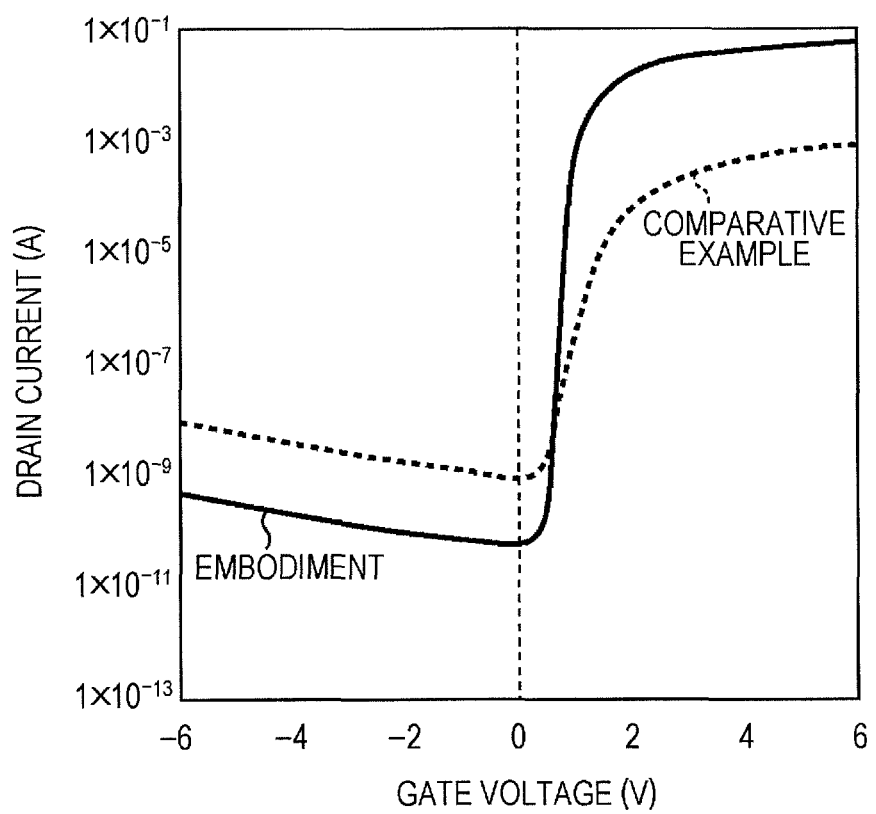
FIG. 3 is a characteristic diagram illustrating a representative characteristic (drain current-gate voltage characteristic) of the AlGaN/GaN HEMT according to the first embodiment compared with a typical AlGaN/GaN HEMT of a comparative example in which a typical p-GaN cap structure is employed.
Figure 4A:
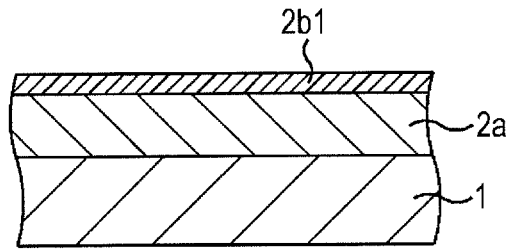
FIGS. 4A to 4C are schematic cross-sectional views that sequentially illustrate the steps of a method for manufacturing an AlGaN/GaN HEMT according to a second embodiment.
Figure 4B:
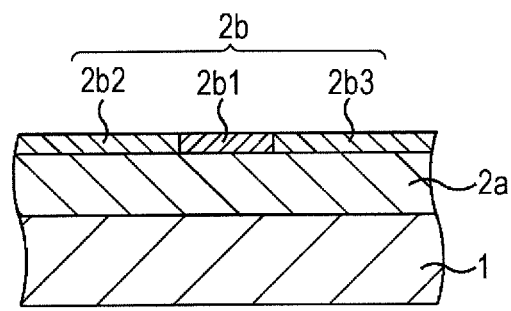
Figure 4C:
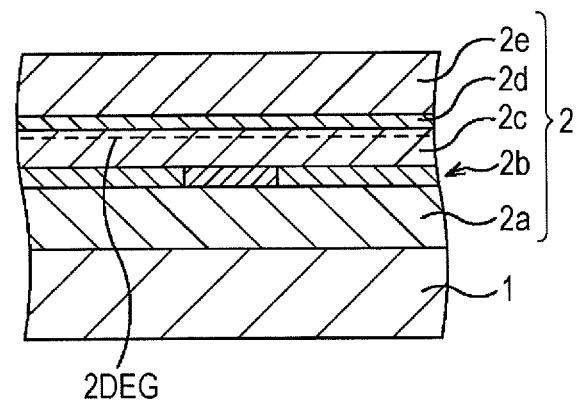

A representative transfer characteristic (drain current-gate voltage characteristic) of the AlGaN/GaN HEMT of this embodiment is compared with a comparative example AlGaN/GaN HEMT having a typical p-GaN cap structure. The results are illustrated in FIG. 3.

In the comparative example, the leak current is high during pinch-off and the maximum drain current ($Id_{max}$) is low. In contrast, in this embodiment, a satisfactory pinch-off characteristic is obtained because the distance between the gate electrode and 2DEG and the number of leak paths at the re-growth interface are reduced.

As discussed above, according to this embodiment, deterioration of characteristics caused by traps such as current collapse is reduced and a highly reliable AlGaN/GaN HEMT that has an improved pinch-off characteristic and gm and reliably achieves a normally off mode is obtained.

Second Embodiment

In a second embodiment, a MIS-type AlGaN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 4A to 5C are schematic cross-sectional views that sequentially illustrate major steps of a method for manufacturing an AlGaN/GaN HEMT of the second embodiment.

Figure 5A:
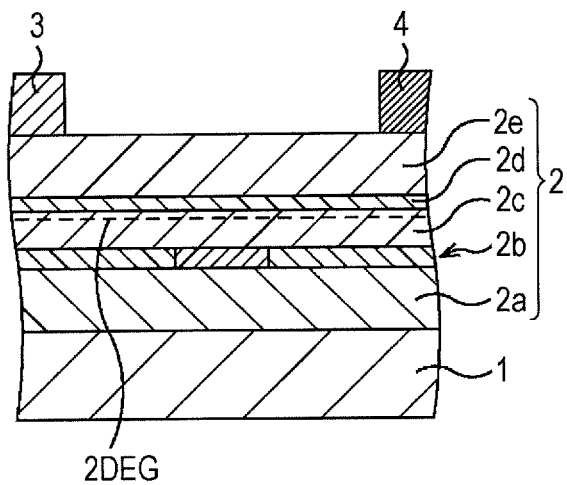
FIGS. 5A to 5C are schematic cross-sectional views that sequentially illustrate the steps of the method for manufacturing the AlGaN/GaN HEMT according to the second embodiment following the steps illustrated in FIGS. 4A to 4C.

As illustrated in FIGS. 4A to 5A, the steps illustrated in FIG. 1A to FIG. 2A of the first embodiment are performed. As illustrated in FIG. 5A, the source electrode 3 and the drain electrode 4 are formed through these steps.

Figure 5B:
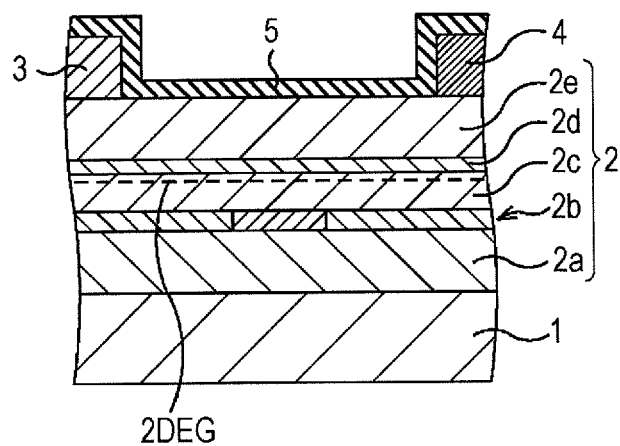

Referring to FIG. 5B, a protective film 5 is formed on the surface of the compound semiconductor composite structure 2.

In particular, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed. In this embodiment, the protective film 5 also functions as a gate insulating film.

Figure 5C:
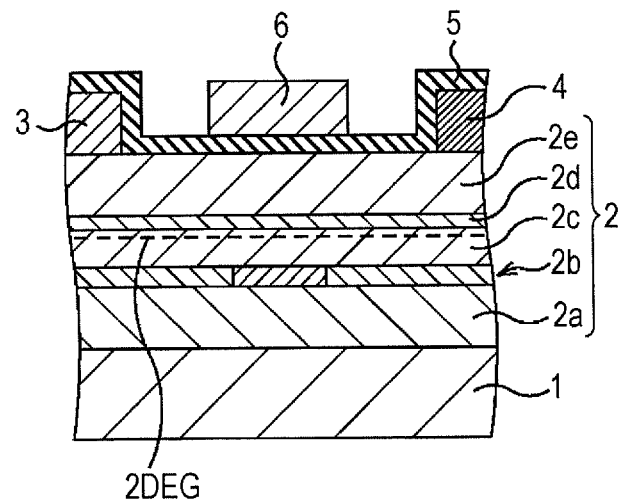

Next, as illustrated in FIG. 5C, a gate electrode 6 is formed. Ni/Au (Ni in the lower layer and Au in the upper layer) is used as an electrode material. In forming the electrode, an overhang structure double layer resist suitable for a vapor deposition method or a lift-off method is used, for example. The resist is applied to the protective film 5 and a resist mask that has an opening that exposes the position where the gate electrode is to be formed is formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 is formed on the protective film 5.

Then electrical connection and the like are established among the source electrode 3, the drain electrode 4, and the gate electrode 6 so as to form a MIS-type AlGaN/GaN HEMT.

As discussed above, according to this embodiment, deterioration of characteristics cause by traps such as current collapse is reduced and a highly reliable AlGaN/GaN HEMT that has an improved pinch-off characteristic and gm and reliably achieves a normally off mode is obtained.

Third Embodiment

In a third embodiment, a MIS-type AlGaN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 6A to 7C are schematic cross-sectional views that sequentially illustrate major steps of a method for manufacturing an AlGaN/GaN HEMT of the third embodiment.

Figure 6A:
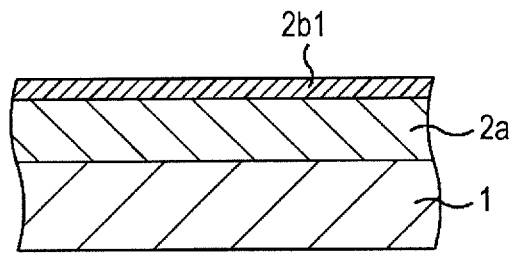
FIGS. 6A to 6C are schematic cross-sectional views that sequentially illustrate the steps of a method for manufacturing an AlGaN/GaN HEMT according to a third embodiment.
Figure 6B:
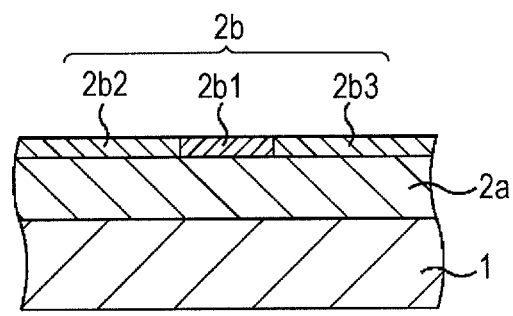
Figure 6C:
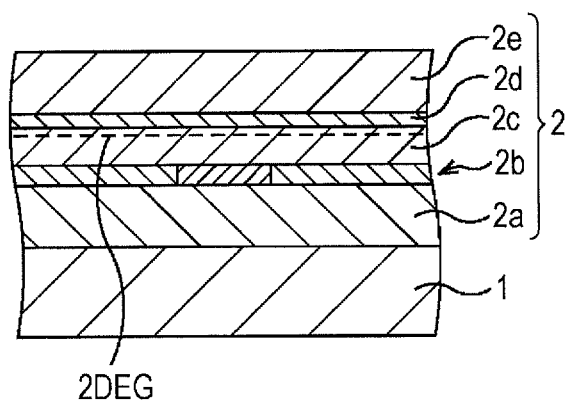

First, as illustrated in FIGS. 6A to 6C, the steps illustrated in FIG. 1A to FIG. 1C of the first embodiment are performed. As illustrated in FIG. 6C, the compound semiconductor composite structure 2 is formed through these steps.

Figure 7A:
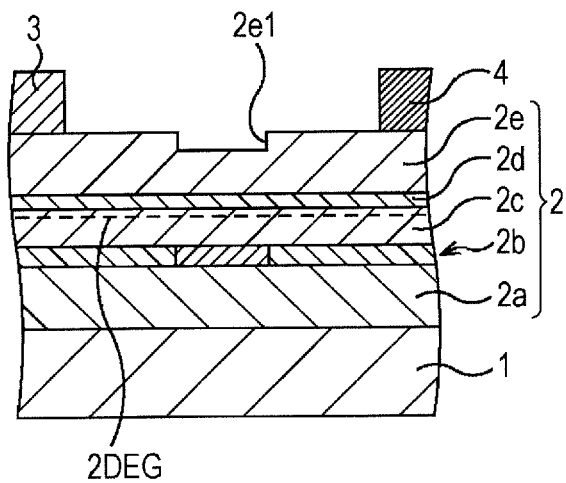
FIGS. 7A to 7C are schematic cross-sectional views that sequentially illustrate the steps of the method for manufacturing the AlGaN/GaN HEMT according to the third embodiment following the steps illustrated in FIGS. 6A to 6C.

Then an element isolation structure is formed. As illustrated in FIG. 7A, an electrode recess 2e1 is formed in the electron donating layer 2e, and then a source electrode 3 and a drain electrode 4 are formed.

In particular, a resist is applied to the entire surface of the compound semiconductor composite structure 2 and is photolithographically processed. As a result, a resist mask having an opening that exposes the position where the gate electrode is to be formed in the electron donating layer 2e is formed.

A portion of the surface layer of the electron donating layer 2e is dry-etched through the resist mask by using, for example, a fluorine-based gas as an etching gas. As a result, the electrode recess 2e1 is formed at the position where the gate electrode is formed in the electron donating layer 2e. The resist mask is removed by an ashing process or a wet process that uses a particular chemical solution.

Next, a Ta/Al (Ta in the lower layer and Al in the upper layer) is used as an electrode material. In forming the electrodes, an overhang structure double layer resist suitable for a vapor deposition method or a lift-off method is used, for example. The resist is applied to the compound semiconductor composite structure 2 and a resist mask having openings at positions where the source electrode and the drain electrode are to be formed is formed. Then Ta/Al is deposited by, for example, a vapor deposition method, through the resist mask. The thickness of Ta is about 20 nm and the thickness of Al is about 200 nm. The overhang structure resist mask and Ta/Al deposited on the resist mask are removed by a lift-off method. Then the SiC substrate 1 is heat-treated in, for example, a nitrogen atmosphere at 400° C. to 1000° C., for example, at about 550° C., so as to cause the remaining Ta/Al to be in ohmic contact with the electron donating layer 2e. In the cases where the Ta/Al and the electron donating layer 2e are in ohmic contact with each other without conducting heat treatment, the heat treatment may be omitted. As a result, the source electrode 3 and the drain electrode 4 each constituted by Ta/Al are formed.

Figure 7B:
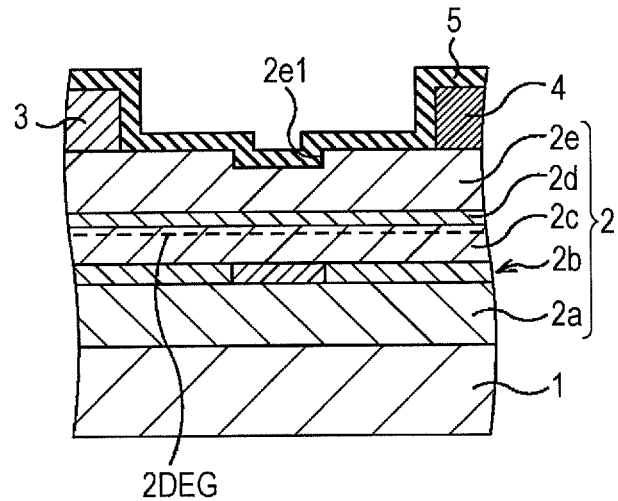

Next, as illustrated in FIG. 7B, a protective film 5 is formed on the surface of the compound semiconductor composite structure 2.

In particular, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed. In this embodiment, the protective film 5 also functions as a gate insulating film.

Figure 7C:
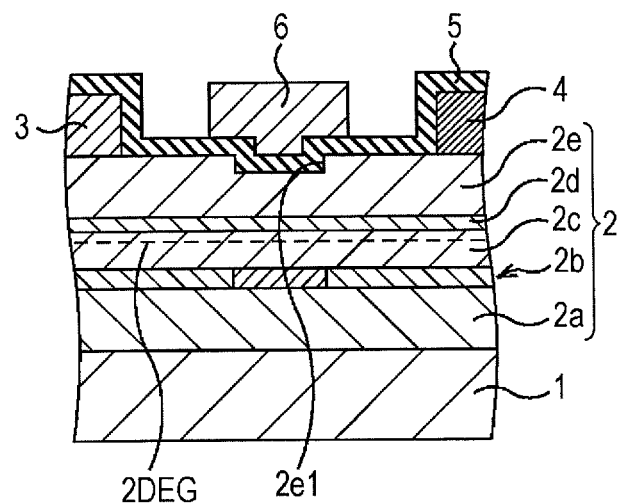

Next, as illustrated in FIG. 7C, a gate electrode 6 is formed.

Ni/Au (Ni in the lower layer and Au in the upper layer) is used as an electrode material. In forming the electrode, an overhang structure double layer resist suitable for a vapor deposition method or a lift-off method is used, for example. The resist is applied to the protective film 5 and a resist mask that has an opening that exposes the position where the gate electrode is to be formed is formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 that fills the interior of the electrode recess 2e1 with the gate metal with the protective film 5 therebetween is formed. The gate electrode 6 is formed to have an overhang shape constituted by Ni that fills the interior of the electrode recess 2e1 with the protective film 5 therebetween and extends over the protective film 5 and Au deposited on Ni.

Then electrical connection and the like are established among the source electrode 3, the drain electrode 4, and the gate electrode 6 so as to form a MIS-type AlGaN/GaN HEMT.

As discussed above, according to this embodiment, deterioration of characteristics caused by traps such as current collapse is reduced and a highly reliable AlGaN/GaN HEMT that has an improved pinch-off characteristic and gm and reliably achieves a normally off mode is obtained.

Fourth Embodiment

In a fourth embodiment, a MIS-type AlGaN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 8A to 9C are schematic cross-sectional views that sequentially illustrate major steps of a method for manufacturing an AlGaN/GaN HEMT of the fourth embodiment.

Figure 8A:
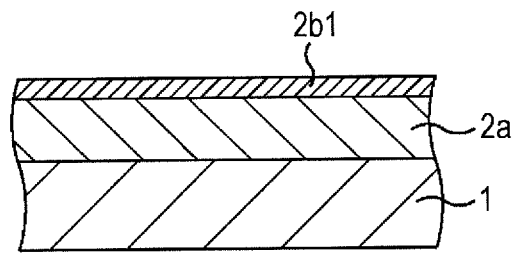
FIGS. 8A to 8C are schematic cross-sectional views that sequentially illustrate the steps of a method for manufacturing an AlGaN/GaN HEMT according to a fourth embodiment.
Figure 8B:
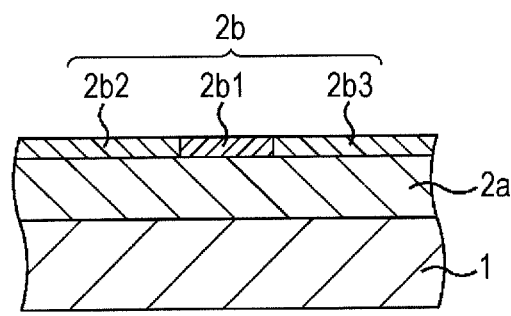

First, as illustrated in FIGS. 8A and 8B, the steps illustrated in FIGS. 1A and 1B of the first embodiment are performed. As illustrated in FIG. 8B, a back barrier layer 2b is formed through these steps.

Figure 8C:
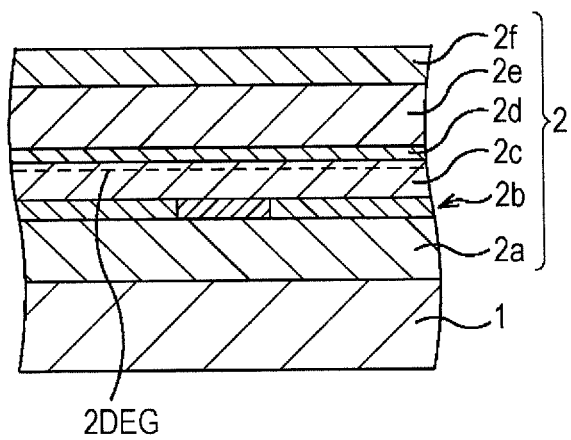

Referring to FIG. 8C, an electron transit layer 2c, an intermediate layer 2d, an electron donating layer 2e, and a cap layer 2f are sequentially formed on the back barrier layer 2b.

Compound semiconductors that form the electron transit layer 2c, the intermediate layer 2d, the electron donating layer 2e, and the cap layer 2f are sequentially grown on the back barrier layer 2b by a MOVPE method. The electron transit layer 2c is formed by growing i-GaN to a thickness of about 100 nm. The intermediate layer 2d is formed by growing i-AlGaN to a thickness of about 5 nm. The electron donating layer 2e is formed by growing n-AlGaN to a thickness of about 30 nm. The cap layer 2f is formed by growing n-GaN to a thickness of about 10 nm. The intermediate layer 2d may sometimes be omitted. The electron donating layer 2e may be formed of i-AlGaN.

A mixed gas of a TMGa gas which is a Ga source and an $NH_3$ gas is used as a source gas for growing GaN. A mixed gas of a TMAl gas, a TMGa gas, and an $NH_3$ gas is used as a source gas for growing AlGaN. Whether to supply TMAl gas or TMGa gas and the flow rate thereof are appropriately set in accordance with the compound semiconductor layer to be grown. The flow rate of the $NH_3$ gas, which is a common material, is about 100 sccm to 10 slm. The growth pressure is about 50 Torr to 300 Torr and the growth temperature is about 1000° C. to 1200° C.

In forming AlGaN and GaN of an n-type, for example, in forming the electron donating layer 2e (n-AlGaN) and the cap layer 2f (n-GaN), an n-type impurity is added to the source gasses of AlGaN and GaN. In this example, a silane ($SiH_4$) gas containing Si is added to the source gas at a particular flow rate, for example, so as to dope AlGaN and GaN with Si. The Si dopant concentration is about $1\times10^{18}/cm^3$ to about $1\times10^{20}/cm^3$, for example, about $5\times10^{18}/cm^3$.

As a result, a compound semiconductor composite structure 2 including the i-GaN layer 2a, the back barrier layer 2b, the electron transit layer 2c, the intermediate layer 2d, the electron donating layer 2e, and the cap layer 2f sequentially stacked is formed.

Figure 9A:
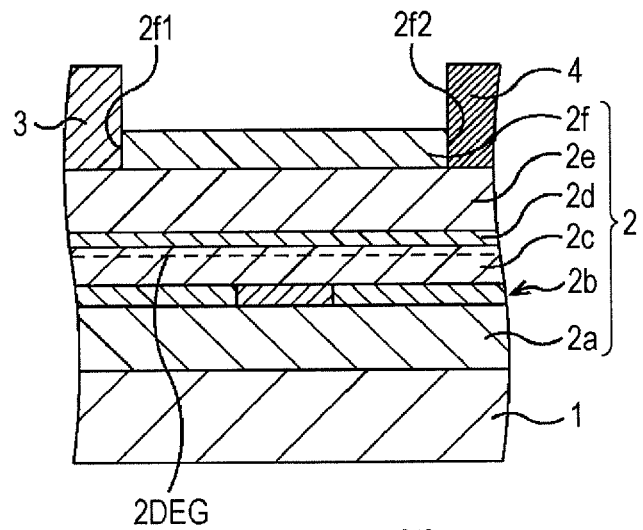
FIGS. 9A to 9C are schematic cross-sectional views that sequentially illustrate the steps of the method for manufacturing the AlGaN/GaN HEMT according to the fourth embodiment following the steps illustrated in FIGS. 8A to 8C.

Next, an element isolation structure is formed and then a source electrode 3 and a drain electrode 4 are formed as illustrated in FIG. 9A.

In particular, a resist is applied to the entire surface of the compound semiconductor composite structure 2 and is photolithographically processed. As a result, a resist mask having openings that expose the positions in the electron donating layer 2e where the surface electrode and the drain electrode are to be formed is formed.

The cap layer 2f is dry etched through the resist mask by using, for example, a fluorine-based gas as an etching gas until the surface of the electron donating layer 2e is exposed. As a result, electrode recesses 2f1 and 2f2 of the cap layer 2f are formed at the positions where the source electrode and the drain electrode are to be formed. The resist mask is removed by an ashing process or a wet process that uses a particular chemical solution.

Next, a source electrode and a drain electrode are formed. Ta/Al (Ta in the lower layer and Al in the upper layer) can be used as the electrode material. The electrodes are formed by using an overhang structure double layer resist suitable for a vapor deposition method and a lift-off method, for example. The resist is applied to the compound semiconductor composite structure 2 and a resist mask having openings that expose the electrode recesses 2f1 and 2f2 is formed. Then Ta/Al is deposited through the resist mask by, for example, a vapor deposition method. The thickness of Ta is about 20 nm and the thickness of Al is about 200 nm. The overhang structure resist mask and Ta/Al deposited on the resist mask are removed by a lift-off method. Then the SiC substrate 1 is heat-treated in, for example, a nitrogen atmosphere at 400° C. to 1000° C., for example, at about 550° C. so as to cause the remaining Ta/Al to be in ohmic contact with the electron donating layer 2e. In the cases where Ta/Al and the electron donating layer 2e are in ohmic contact with each other without conducting heat treatment, the heat treatment may be omitted. As a result, the source electrode 3 and the drain electrode 4 each constituted by Ta/Al and respectively filling the electrode recesses 2f1 and 2f2 are formed.

Figure 9B:
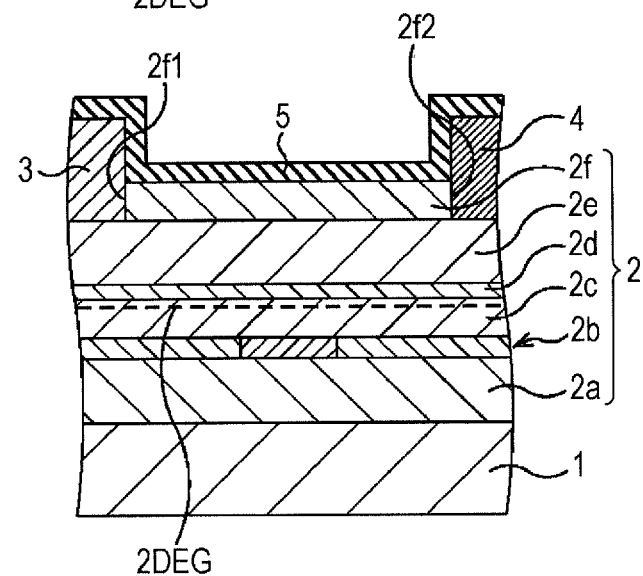

Next, as illustrated in FIG. 9B, a protective film 5 is formed on the surface of the compound semiconductor composite structure 2.

In particular, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed. In this embodiment, the protective film 5 also functions as a gate insulating film.

Figure 9C:
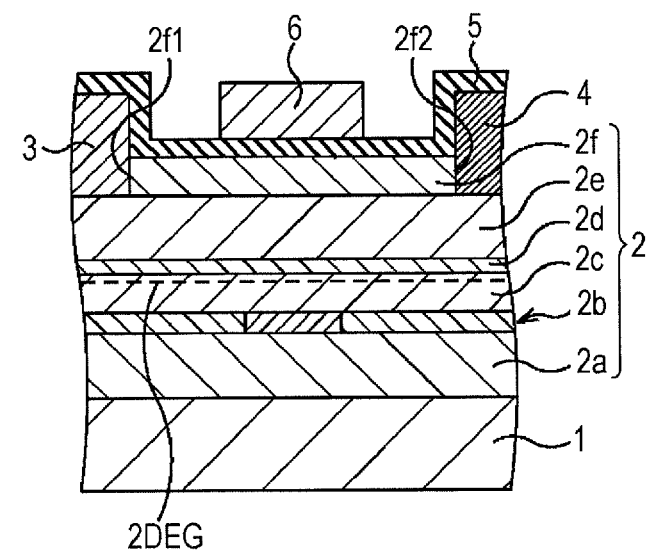

Next, as illustrated in FIG. 9C, the gate electrode 6 is formed.

Ni/Au (Ni in the lower layer and Au in the upper layer) is used as an electrode material, for example. In forming the electrode, an overhang structure double layer resist suitable for a vapor deposition method or a lift-off method is used, for example. The resist is applied to the protective film 5 and a resist mask that has an opening that exposes the position where the gate electrode is to be formed is formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 is formed on the protective film 5.

Then electrical connection and the like are established among the source electrode 3, the drain electrode 4, and the gate electrode 6 so as to form a MIS-type AlGaN/GaN HEMT.

As discussed above, according to this embodiment, deterioration of characteristics caused by traps such as current collapse is reduced and a highly reliable AlGaN/GaN HEMT that has an improved pinch-off characteristic and gm and reliably achieves a normally off mode is obtained.

Fifth Embodiment

In a fifth embodiment, a MIS-type AlGaN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 10A to 11C are schematic cross-sectional views that sequentially illustrate major steps of a method for manufacturing an AlGaN/GaN HEMT of the fifth embodiment.

Figure 10A:
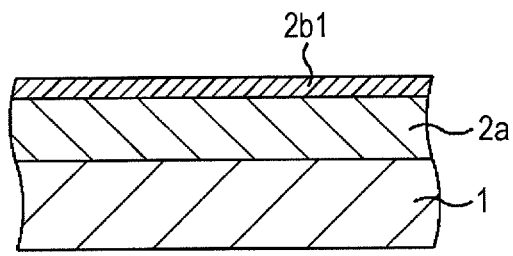
FIGS. 10A to 10C are schematic cross-sectional views that sequentially illustrate the steps of a method for manufacturing an AlGaN/GaN HEMT according to a fifth embodiment.

First, as illustrated in FIG. 10A, the step illustrated in FIG. 1A of the first embodiment is performed so that an i-GaN layer 2a and a p-GaN layer that forms a p-GaN portion 2b1 are sequentially formed on a SiC substrate 1.

Figure 10B:
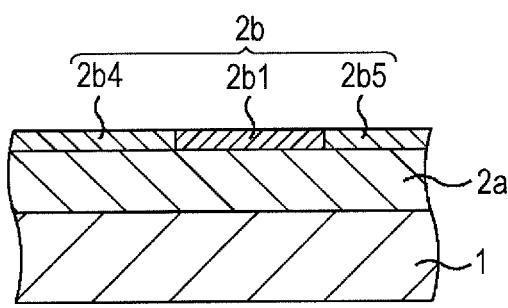

Then as illustrated in FIG. 10B, a back barrier layer 2b is formed.

First, a resist is applied to the p-GaN layer and is photolithographically processed. As a result, a resist mask that covers a portion of the p-GaN layer that forms the p-GaN portion 2b1 and that leaves the rest uncovered is formed. In this embodiment, the portion of the p-GaN layer covered with the resist mask is constituted by a part that is aligned with and below the position where the gate electrode is to be formed and a part that is deviated from the position below where the gate electrode is to be formed toward the portion aligned with and below the position where the drain electrode is to be formed.

An impurity, such as argon (Ar), that deactivates the p-type impurity of p-GaN is ion-implanted through the resist mask at an acceleration energy of 15 keV and a dose of $1 \times 10^{14}/cm^2$, for example. The impurity that deactivates the p-type impurity may be boron (B), oxygen (O), phosphorus (P), iron (Fe), or the like instead of Ar. This ion implantation deactivates all parts except the portion of the p-GaN layer covered with the resist and produces p$^-$-GaN to thereby make p$^-$-GaN portions 2b4 and 2b5. The ionized acceptor concentration in the p$^-$-GaN portions 2b4 and 2b5 is lower than that of the p-GaN portion 2b1. The resist mask is removed by an ashing process or a wet process that uses a particular chemical solution.

A back barrier layer 2b that includes the p-GaN portion 2b1 having a part below the position where the gate electrode is to be formed and the p$^-$-GaN portions 2b4 and 2b5 formed on either side of the p-GaN portion 2b1 is thereby formed through the processes described above. In the back barrier layer 2b, the p-GaN portion 2b1 contains a larger amount of ionized acceptor than the p$^-$-GaN portions 2b4 and 2b5. That is, the back barrier layer 2b is a portion with a high ionized acceptor concentration. The p-GaN portion 2b1 is constituted by a part that is below the position where the gate electrode is to be formed and a part that is deviated toward the drain electrode side from the position below where the gate electrode is to be formed.

Figure 10C:
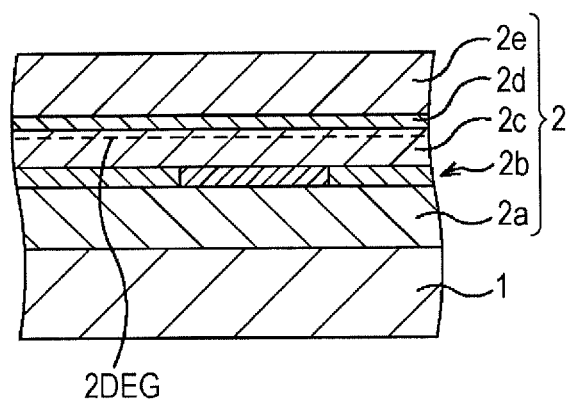

Then, as illustrated in FIG. 10C, the electron transit layer 2c, the intermediate layer 2d, and the electron donating layer 2e are sequentially formed on the back barrier layer 2b.

Compound semiconductors that respectively form the electron transit layer 2c, the intermediate layer 2d, and the electron donating layer 2e are sequentially grown on the back barrier layer 2b by a MOVPE method. The electron transit layer 2c is formed by growing i-GaN to a thickness of about 100 nm. The intermediate layer 2d is formed by growing i-AlGaN to a thickness of about 5 nm. The electron donating layer 2e is formed by growing n-AlGaN to a thickness of about 30 nm. The intermediate layer 2d may sometimes be omitted. The electron donating layer 2e may be formed of i-AlGaN.

A mixed gas of a trimethyl gallium (TMGa) gas which is a Ga source and an ammonia (NH$_3$) gas is used as a source gas for growing GaN. A mixed gas of a TMAl gas, a TMGa gas, and an NH$_3$ gas is used as a source gas for growing AlGaN. Whether to supply TMAl gas or TMGa gas and the flow rate thereof are appropriately set in accordance with the compound semiconductor layer to be grown. The flow rate of the NH$_3$ gas, which is a common material, is about 100 sccm to 10 slm. The growth pressure is about 50 Torr to 300 Torr and the growth temperature is about 1000° C. to 1200° C.

In growing n-type AlGaN, for example, in forming the electron donating layer 2e (n-AlGaN), an n-type impurity is added to the source gas of AlGaN. In this example, a silane ($SiH_4$) gas containing Si is added to the source gas at a particular flow rate, for example, so as to dope AlGaN with Si. The Si dopant concentration is about $1 \times 10^{18}/cm^3$ to about $1 \times 10^{20}/cm^3$, for example, about $5 \times 10^{18}/cm^3$.

As a result, a compound semiconductor composite structure 2 including the sequentially stacked i-GaN layer 2a, back barrier layer 2b, electron transit layer 2c, intermediate layer 2d, and electron donating layer 2e is formed.

Figure 11A:
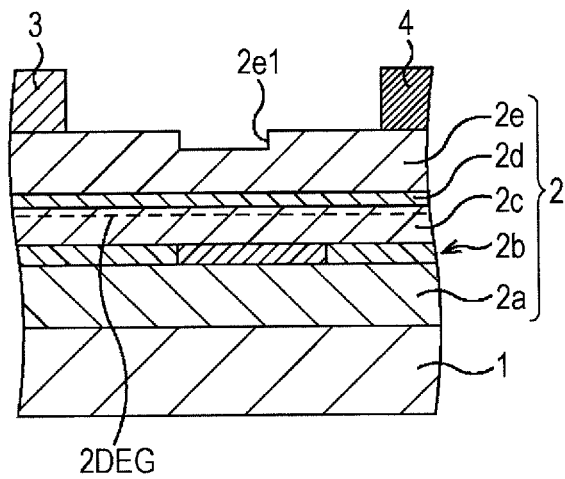
FIGS. 11A to 11C are schematic cross-sectional views that sequentially illustrate the steps of the method for manufacturing the AlGaN/GaN HEMT according to the fifth embodiment following the steps illustrated in FIGS. 10A to 10C.

After an element isolation structure is formed, an electrode recess 2e1 is formed in the electron donating layer 2e and a source electrode 3 and a drain electrode 4 are then formed as illustrated in FIG. 11A.

In particular, first, a resist is applied to the entire surface of the compound semiconductor composite structure 2 and is photolithographically processed. As a result, a resist mask having an opening that exposes the position in the electron donating layer 2e where the gate electrode is to be formed is formed.

A portion of the surface layer of the electron donating layer 2e is dry etched through the resist mask by using a fluorine-based gas as an etching gas, for example. Accordingly, the electrode recess 2e1 is formed at a position in the electron donating layer 2e where the gate electrode is to be formed. The resist mask is removed by an ashing process or a wet process that uses a particular chemical solution.

Next, Ta/Al (Ta in the lower layer and Al in the upper layer) is used as an electrode material. An overhang structure double layer resist suitable for a vapor deposition method and a lift-off method is used in forming electrodes, for example. The resist is applied to the compound semiconductor composite structure 2 so as to form a resist mask having openings that expose the positions where the source electrode and the drain electrode are to be formed. Ta/Al is deposited by, for example, a vapor deposition method through this resist mask. The thickness of Ta is about 20 nm and the thickness of Al is about 200 nm. The overhang structure resist mask and Ta/Al deposited on the resist mask are removed by a lift-off method. Then the SIC substrate 1 is heat-treated in, for example, a nitrogen atmosphere at 400° C. to 1000° C., e.g., at about 550° C., so as to cause the remaining Ta/Al to be in ohmic contact with the electron donating layer 2e. In the cases where the Ta/Al and the electron donating layer 2e are in ohmic contact with each other without conducting heat treatment, the heat treatment may be omitted. As a result, the source electrode 3 and the drain electrode 4 each constituted by Ta/Al are formed.

Figure 11B:
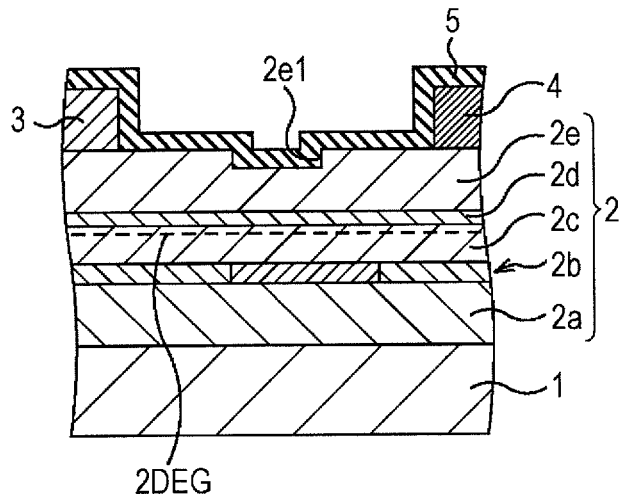

Next, as illustrated in FIG. 11B, a protective film 5 is formed on the surface of the compound semiconductor composite structure 2.

In particular, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed. In this embodiment, the protective film 5 also functions as a gate insulating film.

Figure 11C:
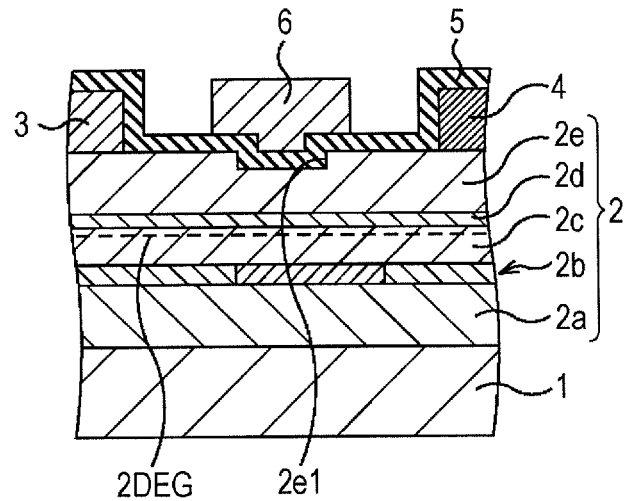

Next, as illustrated in FIG. 11C, a gate electrode 6 is formed.

Ni/Au (Ni in the lower layer and Au in the upper layer) is used as an electrode material. In forming the electrode, an overhang structure double layer resist suitable for a vapor deposition method or a lift-off method is used, for example.

The resist is applied to the protective film 5 so as to form a resist mask that has an opening that exposes the position where the gate electrode is to be formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 that fills the interior of the electrode recess 2e1 with the gate metal with the protective film 5 therebetween is formed. The gate electrode 6 is formed to have an overhang shape constituted by Ni that fills the interior of the electrode recess 2e1 with the protective film 5 therebetween and extends over the protective film 5 and Au deposited on Ni.

Then electrical connection and the like are established among the source electrode 3, the drain electrode 4, and the gate electrode 6 so as to form a MIS-type AlGaN/GaN HEMT.

As discussed above, according to this embodiment, deterioration of characteristics caused by traps such as current collapse is reduced and a highly reliable AlGaN/GaN HEMT that has an improved pinch-off characteristic and gm and reliably achieves a normally off mode is obtained.

Sixth Embodiment

In a sixth embodiment, a MIS-type InAlN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 12A to 13C are schematic cross-sectional views that sequentially illustrate major steps of a method for manufacturing an InAlN/GaN HEMT of the sixth embodiment.

Figure 12A:
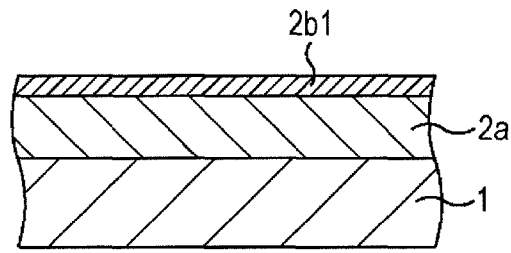
FIGS. 12A to 12C are schematic cross-sectional views that sequentially illustrate the steps of a method for manufacturing an InAlN/GaN HEMT according to a sixth embodiment.
Figure 12B:
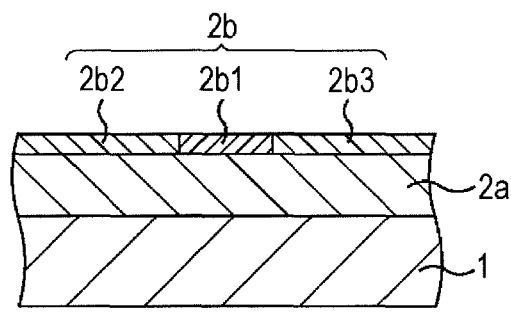

First, as illustrated in FIGS. 12A and 12B, the steps illustrated in FIGS. 1A and 1B of the first embodiment are performed. A back barrier layer 2b is formed through these steps as illustrated in FIG. 12B.

Figure 12C:
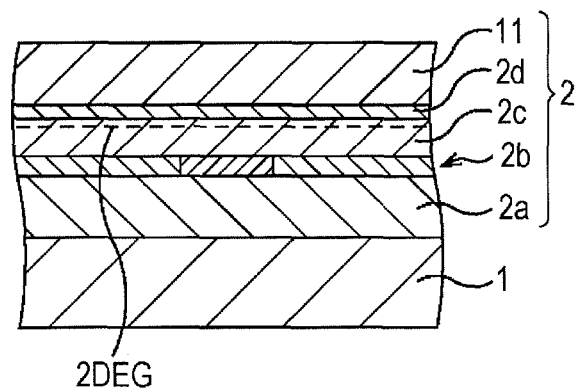

Next, as illustrated in FIG. 12C, the electron transit layer 2c, the intermediate layer 2d, and an electron donating layer 11 are sequentially formed on the back barrier layer 2b.

Compound semiconductors that respectively form the electron transit layer 2c, the intermediate layer 2d, and the electron donating layer 11 are sequentially grown on the back barrier layer 2b by a MOVPE method. The electron transit layer 2c is formed by growing i-GaN to a thickness of about 100 nm. The intermediate layer 2d is formed by growing i-AlGaN to a thickness of about 5 nm. The electron donating layer 11 is formed by growing i-InAlN to a thickness of about 20 nm. The intermediate layer 2d may sometimes be omitted.

A mixed gas of a trimethyl gallium (TMGa) gas which is a Ga source and an ammonia ($NH_3$) gas is used as a source gas for growing GaN. A mixed gas of a TMAl gas, a TMGa gas, and an $NH_3$ gas is used as a source gas for growing AlGaN. Whether to supply TMAl gas or TMGa gas and the flow rate thereof are appropriately set in accordance with the compound semiconductor layer to be grown. A mixed gas of a trimethyl indium (TMIn) gas which is an In source, a TMAl gas, and an ammonia ($NH_3$) gas is used as a source gas for growing InAlN. The flow rate of the $NH_3$ gas, which is a common material, is about 100 sccm to 10 slm. The growth pressure is about 50 Torr to 300 Torr and the growth temperature is about 1000° C. to 1200° C.

As a result, a compound semiconductor composite structure 2 including the i-GaN layer 2a, the back barrier layer 2b, the electron transit layer 2c, the intermediate layer 2d, and the electron donating layer 11 sequentially stacked is formed.

Figure 13A:
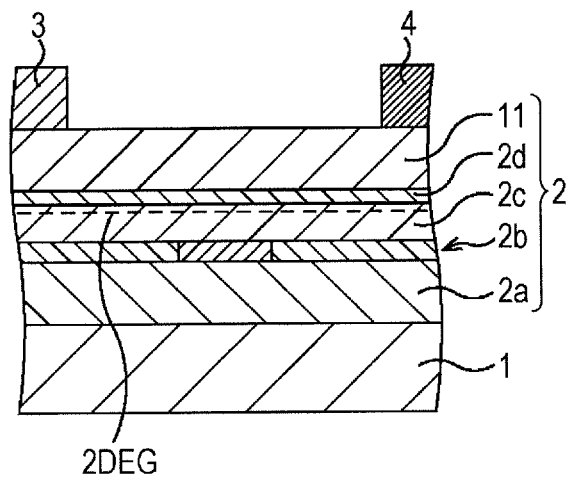
FIGS. 13A to 13C are schematic cross-sectional views that sequentially illustrate the steps of the method for manufacturing the InAlN/GaN HEMT according to the sixth embodiment following the steps illustrated in FIGS. 12A to 12C.

Next, after an element isolation structure is formed, a source electrode 3 and a drain electrode 4 are formed as illustrated in FIG. 13A.

Ta/Al (Ta in the lower layer and Al in the upper layer) is used as an electrode material. In forming the electrodes, an overhang structure double layer resist suitable for a vapor deposition method or a lift-off method is used, for example. The resist is applied to the compound semiconductor composite structure 2 and a resist mask having openings at positions where the source electrode and the drain electrode are to be formed is formed. Then Ta/Al is deposited by, for example, a vapor deposition method, through the resist mask. The thickness of Ta is about 20 nm and the thickness of Al is about 200 nm. The overhang structure resist mask and Ta/Al deposited on the resist mask are removed by a lift-off method. Then the SiC substrate 1 is heat-treated in, for example, a nitrogen atmosphere at 400° C. to 1000° C., for example, at about 550° C., so as to cause the remaining Ta/Al to be in ohmic contact with the electron donating layer 11. In the cases where Ta/Al and the electron donating layer 11 are in ohmic contact with each other without conducting heat treatment, the heat treatment may be omitted. As a result, the source electrode 3 and the drain electrode 4 each constituted by Ta/Al are formed.

Figure 13B:
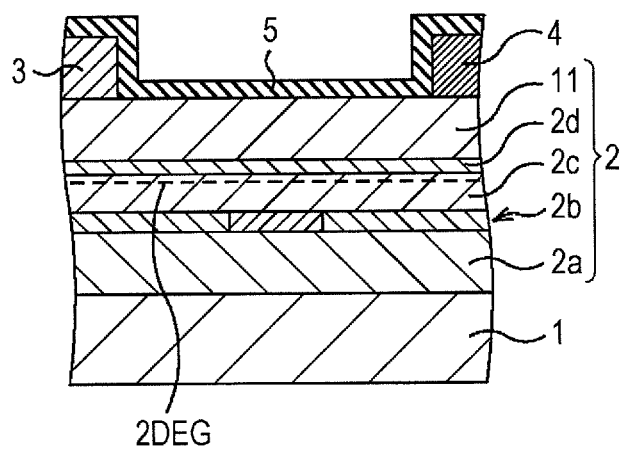

Next, as illustrated in FIG. 13B, a protective film 5 is formed on the surface of the compound semiconductor composite structure 2.

In particular, first, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed.

Figure 13C:
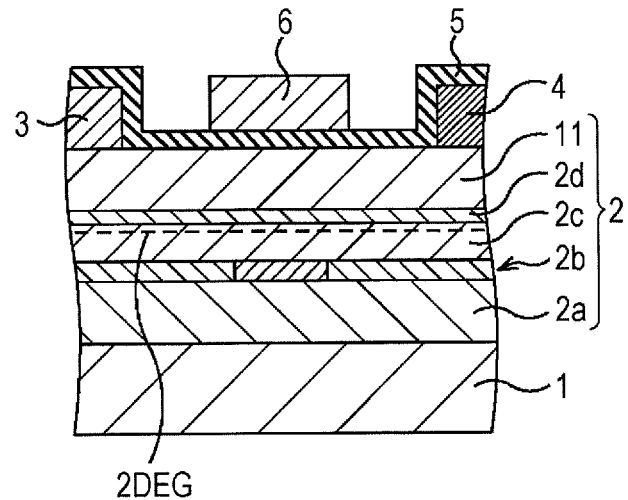

Next, referring to FIG. 13C, a gate electrode 6 is formed

Ni/Au (Ni in the lower layer and Au in the upper layer) is used as an electrode material. In forming the electrode, an overhang structure double layer resist suitable for a vapor deposition method or a lift-off method is used, for example. The resist is applied to the protective film 5 and a resist mask that has an opening that exposes the position where the gate electrode is to be formed is formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 is formed on the protective film 5 on the surface of the compound semiconductor composite structure 2. The gate electrode 6 is formed of Ni and Au which is deposited on the Ni.

Then electrical connection and the like are established among the source electrode 3, the drain electrode 4, and the gate electrode 6 so as to form a MIS-type InAlN/GaN HEMT.

As discussed above, according to this embodiment, deterioration of characteristics caused by traps such as current collapse is reduced and a highly reliable InAlN/GaN HEMT that has an improved pinch-off characteristic and gm and reliably achieves a normally off mode is obtained.

Although an i-InAlN layer is formed as the electron donating layer 11, the electron donating layer 11 may be formed of an InAlGaN layer instead of the i-InAlN layer.

Seventh Embodiment

In a seventh embodiment, a MIS-type AlGaN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 14A to 15C are schematic cross-sectional views that sequentially illustrate major steps of a method for manufacturing an AlGaN/GaN HEMT of the seventh embodiment.

Figure 14A:
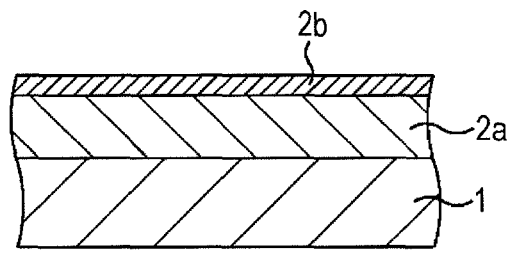
FIGS. 14A to 14C are schematic cross-sectional views that sequentially illustrate the steps of a method for manufacturing an AlGaN/GaN HEMT according to a seventh embodiment.

First, as illustrated in FIG. 14A, the step illustrated in FIG. 1A of the first embodiment is performed so as to sequentially form an i-GaN layer 2a and a p-GaN layer (e.g., Mg concentration of about $1 \times 10^{19}/cm^3$ and a thickness of about 50 nm) that forms a p-GaN portion 2b1 on the SIC substrate 1.

Figure 14B:
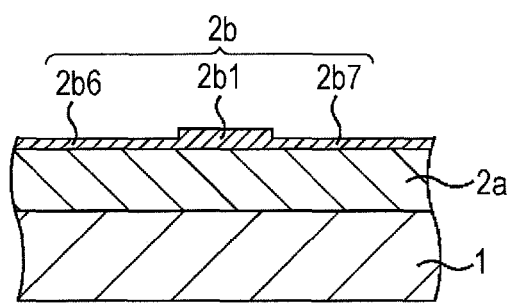

Referring to FIG. 14B, a back barrier layer 2b is formed.

First, a resist is applied to the p-GaN layer and is photolithographically processed. As a result, a resist mask that covers a portion in the p-GaN layer (the portion that will form the p-GaN portion 2b1) aligned with and below the position where a gate electrode is to be formed and that leaves the rest uncovered is formed.

Uncovered portions of the p-GaN layer are dry etched through the resist mask with a chlorine-based gas as an etching gas so as to reduce the thickness of these portions. Here, the thickness of these portions is reduced to about 10 nm.

As a result, a back barrier layer 2b that includes the p-GaN portion 2b1 formed in the portion aligned with and below the position where the gate electrode is to be formed and p$^-$-GaN portions 2b6 and 2b7 which are thinner than the p-GaN portion 2b1 and located on either side of the p-GaN portion 2b1, is formed. In the back barrier layer 2b, the p-GaN portion 2b1 has the same ionized acceptor concentration as the p$^-$-GaN portions 2b6 and 2b7; however, since the p-GaN portion 2b1 is thicker than the p$^-$-GaN portions 2b6 and 2b7, the p-GaN portion 2b1 is a portion that contains a larger amount of ionized acceptor in a unit area.

Figure 14C:
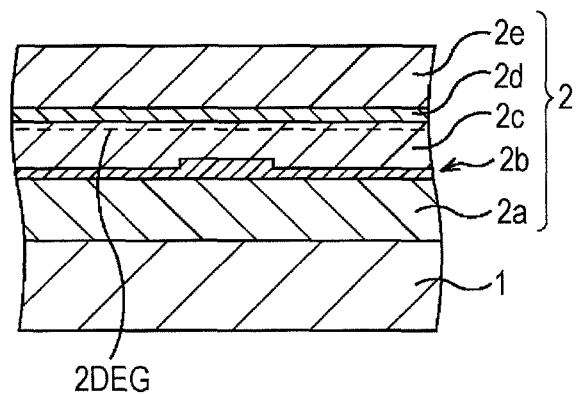

Then, as illustrated in FIG. 14C, an electron transit layer 2c, an intermediate layer 2d, and an electron donating layer 2e are sequentially formed on the back barrier layer 2b.

Compound semiconductors that respectively form the electron transit layer 2c, the intermediate layer 2d, and the electron donating layer 2e are sequentially grown on the back barrier layer 2b by a MOVPE method. The electron transit layer 2c is formed by growing i-GaN to a thickness of about 100 nm. The intermediate layer 2d is formed by growing i-AlGaN to a thickness of about 5 nm. The electron donating layer 2e is formed by growing n-AlGaN to a thickness of about 30 nm. The intermediate layer 2d may sometimes be omitted. The electron donating layer 2e may be formed of i-AlGaN.

A mixed gas of a trimethyl gallium (TMGa) gas which is a Ga source and an ammonia ($NH_3$) gas is used as a source gas for growing GaN. A mixed gas of a TMAl gas, a TMGa gas, and an $NH_3$ gas is used as a source gas for growing AlGaN. Whether to supply TMAl gas or TMGa gas and the flow rate thereof are appropriately set in accordance with the compound semiconductor layer to be grown. The flow rate of the $NH_3$ gas, which is a common material, is about 100 sccm to 10 slm. The growth pressure is about 50 Torr to 300 Torr and the growth temperature is about 1000° C. to 1200° C.

In growing n-type AlGaN, for example, in forming the electron donating layer 2e (n-AlGaN), an n-type impurity is added to the source gas of AlGaN. In this example, a silane ($SiH_4$) gas containing Si is added to the source gas at a particular flow rate, for example, so as to dope AlGaN with Si. The Si dopant concentration is about $1 \times 10^{18}/cm^3$ to about $1 \times 10^{20}/cm^3$, for example, about $5 \times 10^{18}/cm^3$.

As a result, a compound semiconductor composite structure 2 including the sequentially stacked i-GaN layer 2a, back barrier layer 2b, electron transit layer 2c, intermediate layer 2d, and electron donating layer 2e is formed.

Figure 15A:
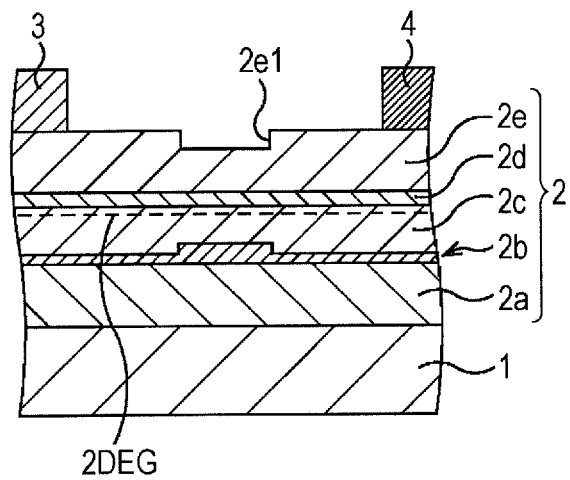
FIGS. 15A to 15C are schematic cross-sectional views that sequentially illustrate the steps of the method for manufacturing the AlGaN/GaN HEMT according to the seventh embodiment following the steps illustrated in FIGS. 14A to 14C.

After an element isolation structure is formed, an electrode recess 2e1 is formed in the electron donating layer 2e and a source electrode 3 and a drain electrode 4 are then formed as illustrated in FIG. 15A.

In particular, first, a resist is applied to the entire surface of the compound semiconductor composite structure 2 and is photolithographically processed. As a result, a resist mask having an opening that exposes the position in the electron donating layer 2e where the gate electrode is to be formed is formed.

A portion of the surface layer of the electron donating layer 2e is dry etched through the resist mask by using a fluorine-based gas as an etching gas, for example. Accordingly, the electrode recess 2e1 is formed at a position in the electron donating layer 2e where the gate electrode is to be formed. The resist mask is removed by an ashing process or a wet process that uses a particular chemical solution.

Next, Ta/Al (Ta in the lower layer and Al in the upper layer) is used as an electrode material. An overhang structure double layer resist suitable for a vapor deposition method and a lift-off method is used in forming electrodes, for example. The resist is applied to the compound semiconductor composite structure 2 and a resist mask having openings that expose the positions where the source electrode and the drain electrode are to be formed is formed. Ta/Al is deposited by, for example, a vapor deposition method through this resist mask. The thickness of Ta is about 20 nm and the thickness of Al is about 200 nm. The overhang structure resist mask and Ta/Al deposited on the resist mask are removed by a lift-off method. Then the SiC substrate 1 is heat-treated in, for example, a nitrogen atmosphere at 400° C. to 1000° C., e.g., at about 550° C., so as to cause the remaining Ta/Al to be in ohmic contact with the electron donating layer 2e. In the cases where the Ta/Al and the electron donating layer 2e are in ohmic contact with each other without conducting heat treatment, the heat treatment may be omitted. As a result, the source electrode 3 and the drain electrode 4 each constituted by Ta/Al are formed.

Figure 15B:
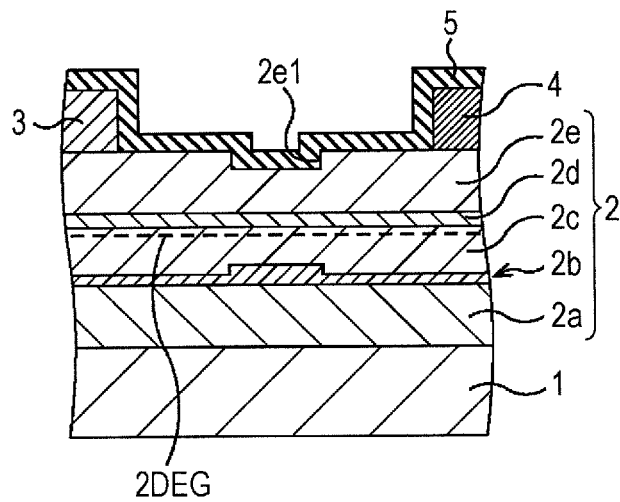

Next, as illustrated in FIG. 15B, a protective film 5 is formed on the surface of the compound semiconductor composite structure 2.

In particular, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed. In this embodiment, the protective film 5 also functions as a gate insulating film.

Figure 15C:
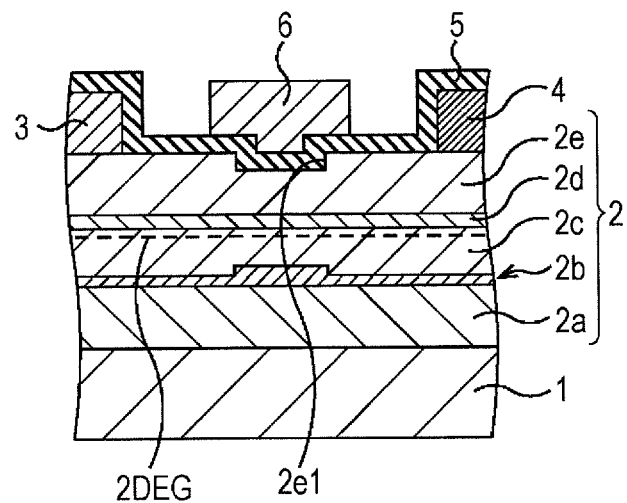

Next, as illustrated in FIG. 15C, a gate electrode 6 is formed.

Ni/Au (Ni in the lower layer and Au in the upper layer) is used as an electrode material. In forming the electrode, an overhang structure double layer resist suitable for a vapor deposition method or a lift-off method is used, for example. The resist is applied to the protective film 5 and a resist mask that has an opening that exposes the position where the gate electrode is to be formed is formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 that fills the interior of the electrode recess 2e1 with the gate metal with the protective film 5 therebetween is formed. The gate electrode 6 is formed to have an overhang shape constituted by Ni that fills the interior of the electrode recess 2e1 with the protective film 5 therebetween and extends over the protective film 5 and Au deposited on Ni.

Then electrical connection and the like are established among the source electrode 3, the drain electrode 4, and the gate electrode 6 so as to form a MIS-type AlGaN/GaN HEMT.

As discussed above, according to this embodiment, deterioration of characteristics caused by traps such as current collapse is reduced and a highly reliable AlGaN/GaN HEMT that has an improved pinch-off characteristic and gm and reliably achieves a normally off mode is obtained.

Eighth Embodiment

In an eighth embodiment, a MIS-type AlGaN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 16A to 17C are schematic cross-sectional views that sequentially illustrate major steps of a method for manufacturing an AlGaN/GaN HEMT of the eighth embodiment.

Figure 16A:
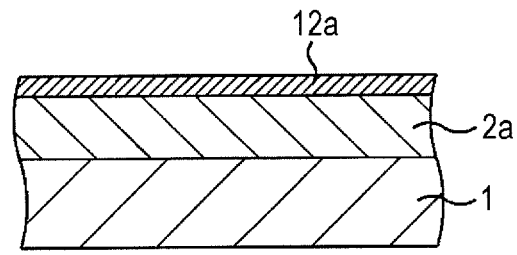
FIGS. 16A to 16C are schematic cross-sectional views that sequentially illustrate the steps of a method for manufacturing an AlGaN/GaN HEMT according to an eighth embodiment.

First, as illustrated in FIG. 16A, an i-GaN layer 2a and a p-AlGaN layer that forms a p-AlGaN portion 12a are sequentially formed on the SIC substrate 1.

In particular, the i-GaN layer 2a and the p-AlGaN layer that forms the p-AlGaN portion 12a are sequentially grown on the SiC substrate 1 by a MOVPE method.

The i-GaN layer 2a is formed by growing i-GaN to a thickness of about 3 μm, for example. The p-AlGaN layer that forms the p-AlGaN portion 12a is formed by growing p-AlGaN to a thickness of about 50 nm.

A mixed gas of a TMGa gas which is a Ga source and an $NH_3$ gas is used as a source gas for growing GaN. A mixed gas of a TMGa gas, which is a Ga source, a TMAl gas, which is an Al source, and an $NH_3$ gas is used as a source gas for growing AlGaN. The flow rates of the TMAl gas and TMGa gas are appropriately set and the flow rate of $NH_3$ gas is set to about 100 sccm to 10 slm. The growth pressure is about 50 Torr to 300 Torr and the growth temperature is about 1000° C. to 1200° C.

In growing p-type AlGaN, for example, in forming the p-AlGaN layer that forms the p-AlGaN portion 12a, a p-type impurity such as Mg, C, or Zn is added to the source gas of AlGaN. For example, Mg is added to the source gas. In particular, a Mg-containing gas, e.g., a Cp2Mg gas is added to a source gas at a particular flow rate so as to dose AlGaN with Mg. The Mg dopant concentration is about $1\times10^{16}/cm^3$ to about $1\times10^{21}/cm^3$, for example, about $1\times10^{19}/cm^3$. After the p-AlGaN layer is formed, the p-AlGaN layer is heat-treated at about 400° C. to 1200° C., e.g., at about 800° C., to activate the p-type impurity, Mg.

Figure 16B:
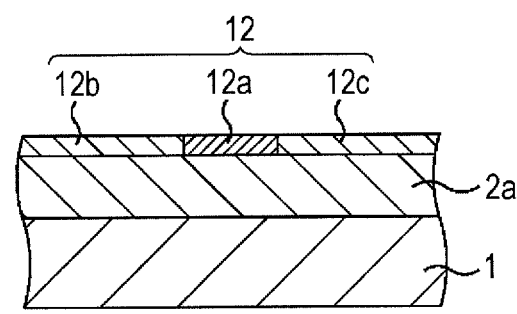

Next, as illustrated in FIG. 16B, a back barrier layer 12 is formed.

First, a resist is applied to the p-AlGaN layer and is photolithographically processed. As a result, a resist mask that covers the portion in the p-AlGaN layer (portion that will form a p-AlGaN portion 12a) aligned with and below the position where the gate electrode is to be formed and that leaves the rest uncovered is formed.

An impurity, such as argon (Ar), that deactivates the p-type impurity of p-AlGaN is ion-implanted through the resist mask at an acceleration energy of 15 keV and a dose of $1\times10^{14}/cm^2$, for example. The impurity that deactivates the p-type impurity may be boron (B), oxygen (O), phosphorus (P), iron (Fe), or the like instead of Ar. This ion implantation deactivates all parts of the p-AlGaN layer except the position where the gate electrode is to be formed and produces p⁻-AlGaN to thereby make p⁻-AlGaN portions 12b and 12c. The ionized acceptor concentration in the p⁻-AlGaN portions 12b and 12c is lower than that of the p-AlGaN portion 12a. The resist mask is removed by an ashing process or a wet process that uses a particular chemical solution.

A back barrier layer 12 that includes the p-AlGaN portion 12a formed in the portion aligned with and below the position where the gate electrode is to be formed and the p⁻-AlGaN portions 12b and 12c formed on either side of the p-AlGaN portion 12a is thereby formed through the processes described above. In the back barrier layer 12, the p-AlGaN portion 12a contains a larger amount of ionized acceptor than the p⁻-AlGaN portions 12b and 12c. That is, the p-AlGaN portion 12a is a portion with a high ionized acceptor concentration.

Figure 16C:
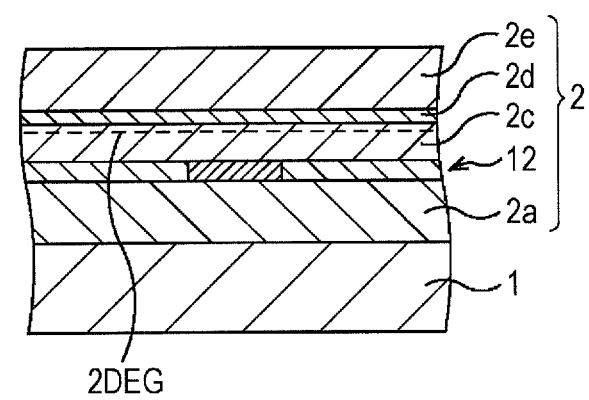

Next, as illustrated in FIG. 16C, an electron transit layer 2c, an intermediate layer 2d, and an electron donating layer 2e are sequentially formed on the back barrier layer 12.

Compound semiconductors that respectively form the electron transit layer 2c, the intermediate layer 2d, and the electron donating layer 2e are sequentially grown on the back barrier layer 12 by a MOVPE method. The electron transit layer 2c is formed by growing i-GaN to a thickness of about 100 nm. The intermediate layer 2d is formed by growing i-AlGaN to a thickness of about 5 nm. The electron donating layer 2e is formed by growing n-AlGaN to a thickness of about 30 nm. The intermediate layer 2d may sometimes be omitted. The electron donating layer 2e may be formed of i-AlGaN.

A mixed gas of a TMGa gas which is a Ga source and an ammonia ($NH_3$) gas is used as a source gas for growing GaN. A mixed gas of a TMAl gas, a TMGa gas, and an $NH_3$ gas is used as a source gas for growing AlGaN. Whether to supply TMAl gas or TMGa gas and the flow rate thereof are appropriately set in accordance with the compound semiconductor layer to be grown. The flow rate of the $NH_3$ gas, which is a common material, is about 100 sccm to 10 slm. The growth pressure is about 50 Torr to 300 Torr and the growth temperature is about 1000° C. to 1200° C.

In growing n-type AlGaN, for example, in forming the electron donating layer 2e (n-AlGaN), an n-type impurity is added to the source gas of AlGaN. In this example, a silane ($SiH_4$) gas containing Si is added to the source gas at a particular flow rate, for example, so as to dope AlGaN with Si. The Si dopant concentration is about $1\times10^{18}/cm^3$ to about $1\times10^{20}/cm^3$, for example, about $5\times10^{18}/cm^3$.

As a result, a compound semiconductor composite structure 2 including the i-GaN layer 2a, the back barrier layer 12, the electron transit layer 2c, the intermediate layer 2d, and the electron donating layer 2e sequentially stacked is formed.

Figure 17A:
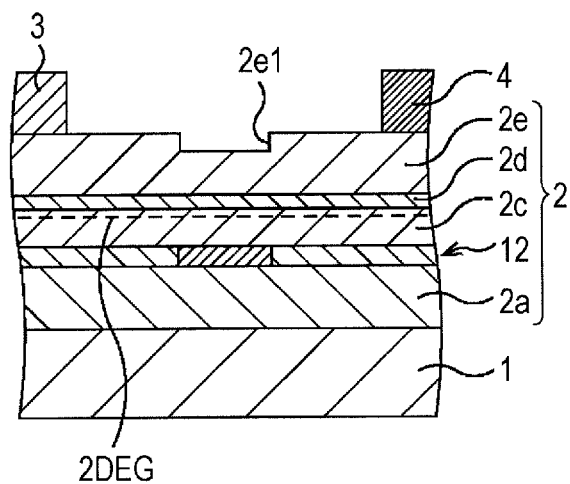
FIGS. 17A to 17C are schematic cross-sectional views that sequentially illustrate the steps of the method for manufacturing the AlGaN/GaN HEMT according to the eighth embodiment following the steps illustrated in FIGS. 16A to 16C.

Next, after an element isolation structure is formed, an electrode recess 2e1 is formed in the electron donating layer 2e and then a source electrode 3 and a drain electrode 4 are formed as illustrated in FIG. 17A.

In particular, first, a resist is applied to the entire surface of the compound semiconductor composite structure 2 and lithographically processed. As a result, a resist mask having an opening that exposes the position in the electron donating layer 2e where the gate electrode is to be formed is formed.

A part of the surface layer of the electron donating layer 2e is dry-etched through the resist mask by using, for example, a fluorine-based gas as an etching gas. As a result, the electrode recess 2e1 is formed in the position in the electron donating layer 2e where the gate electrode is to be formed is formed. The resist mask is removed by an ashing process or a wet process that uses a particular chemical solution.

Next, a Ta/Al (Ta in the lower layer and Al in the upper layer) is used as an electrode material. In forming the electrodes, an overhang structure double layer resist suitable for a vapor deposition method or a lift-off method is used, for example. The resist is applied to the compound semiconductor composite structure 2 and a resist mask having openings at positions where the source electrode and the drain electrode are to be formed is formed. Then Ta/Al is deposited by, for example, a vapor deposition method, through the resist mask. The thickness of Ta is about 20 nm and the thickness of Al is about 200 nm. The overhang structure resist mask and Ta/Al deposited on the resist mask are removed by a lift-off method. Then the SiC substrate 1 is heat-treated in, for example, a nitrogen atmosphere at 400° C. to 1000° C., for example, at about 550° C., so as to cause the remaining Ta/Al to be in ohmic contact with the electron donating layer 2e. In the cases where the Ta/Al and the electron donating layer 2e are in ohmic contact with each other without conducting heat treatment, the heat treatment may be omitted. As a result, the source electrode 3 and the drain electrode 4 each constituted by Ta/Al are formed.

Figure 17B:
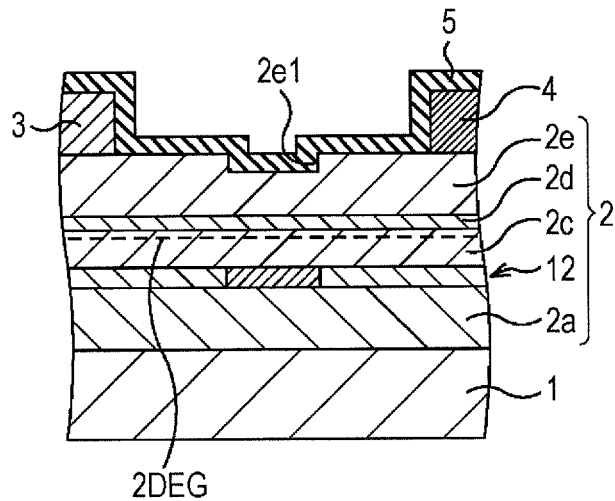

Next, as illustrated in FIG. 17B, a protective film 5 is formed on the surface of the compound semiconductor composite structure 2.

In particular, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed. In this embodiment, the protective film 5 also functions as a gate insulating film.

Figure 17C:
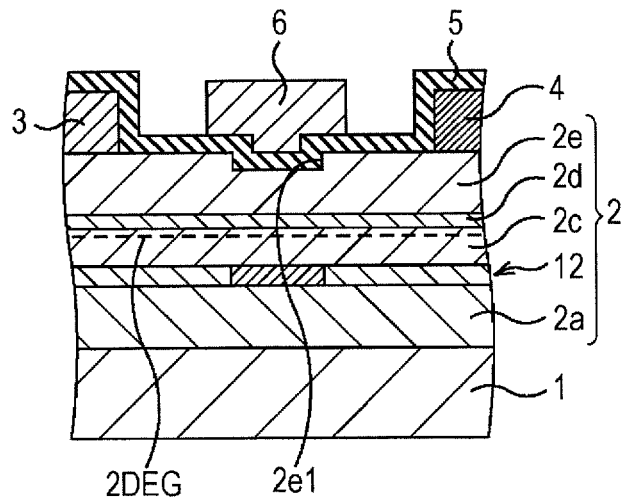

Next, as illustrated in FIG. 17C, a gate electrode 6 is formed.

Ni/Au (Ni in the lower layer and Au in the upper layer) is used as an electrode material. In forming the electrode, an overhang structure double layer resist suitable for a vapor deposition method or a lift-off method is used, for example. The resist is applied to the protective film 5 to form a resist mask that has an opening that exposes the position where the gate electrode is to be formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 that fills the interior of an electrode recess 2e1 with the gate metal with the protective film 5 therebetween is formed. The gate electrode 6 is formed to have an overhang shape constituted by Ni that fills the interior of the electrode recess 2e1 with the protective film 5 therebetween and extends over the protective film 5 and Au deposited on Ni.

Then electrical connection and the like are established among the source electrode 3, the drain electrode 4, and the gate electrode 6 so as to form a MIS-type AlGaN/GaN HEMT.

As discussed above, according to this embodiment, deterioration of characteristics caused by traps such as current collapse is reduced and a highly reliable AlGaN/GaN HEMT that has an improved pinch-off characteristic and gm and reliably achieves a normally off mode is obtained.

Ninth Embodiment

In a ninth embodiment, a MIS-type AlGaN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 18A to 19C are schematic cross-sectional views that sequentially illustrate major steps of a method for manufacturing an AlGaN/GaN HEMT of the ninth embodiment.

Figure 18A:
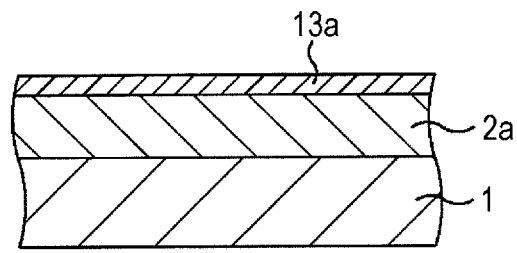
FIGS. 18A to 18C are schematic cross-sectional views that sequentially illustrate the steps of a method for manufacturing an AlGaN/GaN HEMT according to a ninth embodiment.

First, as illustrated in FIG. 18A, an i-GaN layer 2a and a p-InAlN layer that forms a p-InAlN portion 13a are sequentially formed on the SiC substrate 1.

In particular, the i-GaN layer 2a and the p-InAlN layer that forms a p-InAlN portion 13a are sequentially grown on the SiC substrate 1 by a MOVPE method.

The i-GaN layer 2a is formed by growing i-GaN to a thickness of about 3 μm, for example. The P-InAlN layer that forms the p-InAlN portion 13a is formed by growing p-InAlN to a thickness of about 50 nm.

A mixed gas of a TMGa gas which is a Ga source and an $NH_3$ gas is used as a source gas for growing GaN. A mixed gas of a TMIn gas, which is an In source, a TMAl gas, which is an Al source, and an $NH_3$ gas is used as a source gas for growing InAlN. The flow rates of the TMIn gas and the TMAl gas are appropriately set. The flow rate of the $NH_3$ gas is about 100 sccm to 10 slm. The growth pressure is about 50 Torr to 300 Torr and the growth temperature is about 1000° C. to 1200° C.

In growing p-type InAlN, i.e., in forming a p-InAlN layer that forms the p-InAlN portion 13a, a p-type impurity, Mg, C, Zn, or the like is added to the source gas of InAlN. For example, Mg is added to the source gas of InAlN. In this example, a Cp2Mg gas containing Mg is added to the source gas at a particular flow rate so as to dope InAlN with Mg. The Mg dopant concentration is about $1×10^{16}/cm^3$ to about $1×10^{21}/cm^3$, e.g., about $1×10^{19}/cm^3$.

After the p-InAlN layer is formed, the p-InAlN layer is heat-treated at about 400° C. to 1200° C., for example, at about 800° C. to activate the p-type impurity, Mg.

Figure 18B:
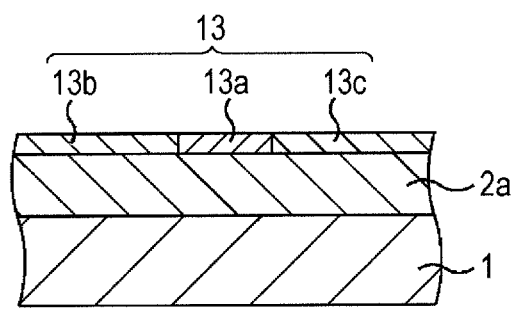

As illustrated in FIG. 18B, a back barrier layer 13 is formed.

First, a resist is applied to the p-InAlN layer and is photolithographically processed. As a result, a resist mask that covers the portion in the p-InAlN layer (portion that will form the p-InAlN portion 13a) aligned with and below the position where the gate electrode is to be formed and that leaves the rest uncovered is formed.

An impurity, e.g., argon (Ar), that deactivates the p-type impurity of p-InAlN is ion-implanted through the resist mask at an acceleration energy of 15 keV and a dose of $1×10^{14}/cm^2$. The impurity that deactivates the p-type impurity may be boron (B), oxygen (O), phosphorus (P), iron (Fe), or the like instead of Ar. This ion implantation deactivates all parts of the p-AlGaN layer except the position where the gate electrode is to be formed and produces p⁻-InAlN to thereby make p⁻-InAlN portions 13b and 13c. The ionized acceptor concentration in the p⁻-InAlN portions 13b and 13c is lower than that of the p-InAlN portion 13a. The resist mask is removed by an ashing process or a wet process that uses a particular chemical solution.

A back barrier 13 that includes the p-InAlN portion 13a formed in the portion aligned with and below the position where the gate electrode is to be formed and the p⁻-InAlN portions 13b and 13c formed on either side of the p-InAlN portion 13a is formed through the processes described above. In the back barrier layer 13, the p-InAlN portion 13a contains a larger amount of ionized acceptor than the p⁻-InAlN portions 13b and 13c. That is, the p-InAlN portion 13a is a portion with a high ionized acceptor concentration.

Figure 18C:
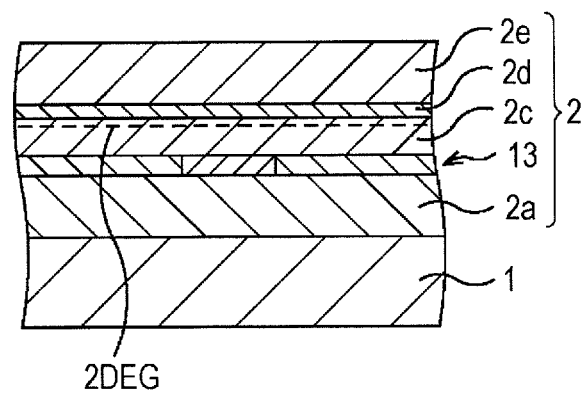

Then, as illustrated in FIG. 18C, an electron transit layer 2c, an intermediate layer 2d, and an electron donating layer 2e are sequentially formed on the back barrier layer 13.

Compound semiconductors that respectively form the electron transit layer 2c, the intermediate layer 2d, and the electron donating layer 2e are sequentially grown on the back barrier layer 13 by a MOVPE method. The electron transit layer 2c is formed by growing i-GaN to a thickness of about 100 nm. The intermediate layer 2d is formed by growing i-AlGaN to a thickness of about 5 nm. The electron donating layer 2e is formed by growing n-AlGaN to a thickness of about 30 nm. The intermediate layer 2d may sometimes be omitted. The electron donating layer 2e may be formed of i-AlGaN.

A mixed gas of TMGa, which is a Ga source, and an $NH_3$ gas is used as a source gas for growing GaN. A mixed gas of a TMAl gas, a TMGa gas, and an $NH_3$ gas is used as a source gas for growing AlGaN. Whether to supply TMAl gas or TMGa gas and the flow rate thereof are appropriately set in accordance with the compound semiconductor layer to be grown. The flow rate of the $NH_3$ gas, which is a common material, is about 100 sccm to 10 slm. The growth pressure is about 50 Torr to 300 Torr and the growth temperature is about 1000° C. to 1200° C.

In growing n-type AlGaN, i.e., in forming the electron donating layer 2e (n-AlGaN), an n-type impurity is added to the source gas of AlGaN. In this example, a silane ($SiH_4$) gas containing Si is added to the source gas at a particular flow rate, for example, so as to dope AlGaN with Si. The Si dopant concentration is about $1×10^{18}/cm^3$ to about $1×10^{20}/cm^3$, for example, about $5×10^{18}/cm^3$.

As a result, a compound semiconductor composite structure 2 including the sequentially stacked i-GaN layer 2a, back barrier layer 13, electron transit layer 2c, intermediate layer 2d, and electron donating layer 2e is formed.

Figure 19A:
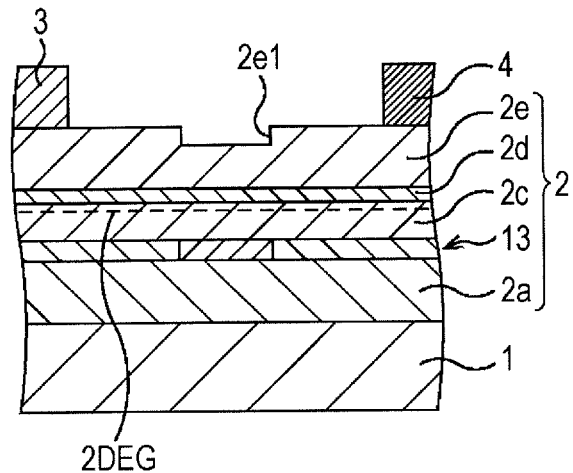
FIGS. 19A to 19C are schematic cross-sectional views that sequentially illustrate the steps of the method for manufacturing the AlGaN/GaN HEMT according to the ninth embodiment following the steps illustrated in FIGS. 18A to 18C.

After an element isolation structure is formed, an electrode recess 2e1 is formed in the electron donating layer 2e and a source electrode 3 and a drain electrode 4 are then formed as illustrated in FIG. 19A.

In particular, first, a resist is applied to the entire surface of the compound semiconductor composite structure 2 and is photolithographically processed. As a result, a resist mask having an opening that exposes the position in the electron donating layer 2e where the gate electrode is to be formed is formed.

A portion of the surface layer of the electron donating layer 2e is dry etched through the resist mask by using a fluorine-based gas as an etching gas, for example. Accordingly, the electrode recess 2e1 is formed at a position in the electron donating layer 2e where the gate electrode is to be formed. The resist mask is removed by an ashing process or a wet process that uses a particular chemical solution.

Next, Ta/Al (Ta in the lower layer and Al in the upper layer) is used as an electrode material. An overhang structure double layer resist suitable for a vapor deposition method and a lift-off method is used in forming electrodes, for example. The resist is applied to the compound semiconductor composite structure 2 and a resist mask having openings that expose the positions where the source electrode and the drain electrode are to be formed is formed. Ta/Al is deposited by, for example, a vapor deposition method through this resist mask. The thickness of Ta is about 20 nm and the thickness of Al is about 200 nm. The overhang structure resist mask and Ta/Al deposited on the resist mask are removed by a lift-off method. Then the SiC substrate 1 is heat-treated in, for example, a nitrogen atmosphere at 400° C. to 1000° C., e.g., at about 550° C., so as to cause the remaining Ta/Al to be in ohmic contact with the electron donating layer 2e. In the cases where the Ta/Al and the electron donating layer 2e are in ohmic contact with each other without conducting heat treatment, the heat treatment may be omitted. As a result, the source electrode 3 and the drain electrode 4 each constituted by Ta/Al are formed.

Figure 19B:
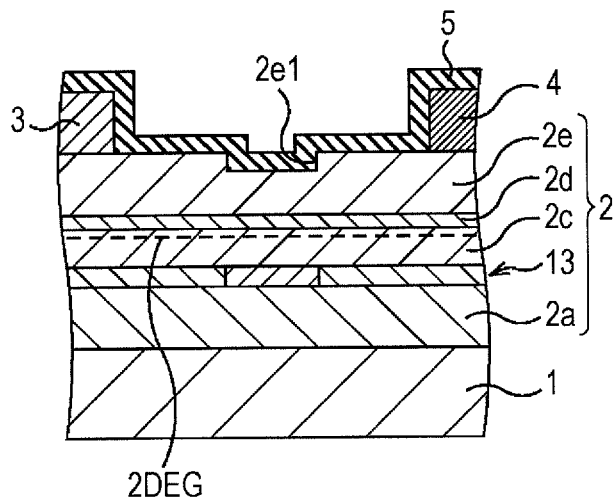

Next, as illustrated in FIG. 19B, a protective film 5 is formed on the surface of the compound semiconductor composite structure 2.

In particular, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed. In this embodiment, the protective film 5 also functions as a gate insulating film.

Figure 19C:
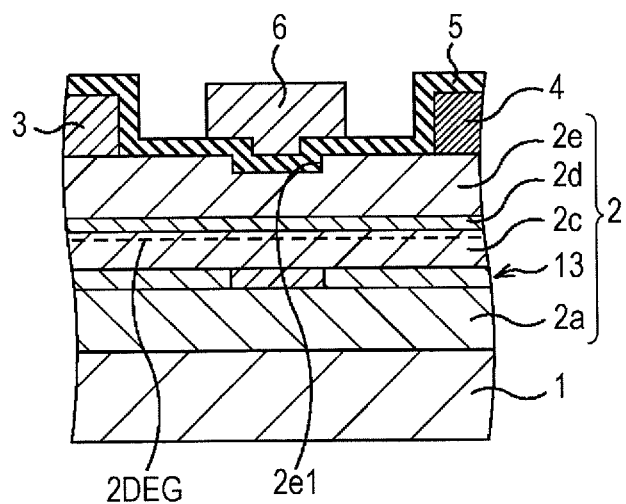

Next, as illustrated in FIG. 19C, a gate electrode 6 is formed.

Ni/Au (Ni in the lower layer and Au in the upper layer) is used as an electrode material. In forming the electrode, an overhang structure double layer resist suitable for a vapor deposition method or a lift-off method is used, for example. The resist is applied to the protective film 5 so as to form a resist mask that has an opening that exposes the position where the gate electrode is to be formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 that fills the interior of the electrode recess 2e1 with the gate metal with the protective film 5 therebetween is formed. The gate electrode 6 is formed to have an overhang shape constituted by Ni that fills the interior of the electrode recess 2e1 with the protective film 5 therebetween and extends over the protective film 5 and Au deposited on Ni.

Then electrical connection and the like are established among the source electrode 3, the drain electrode 4, and the gate electrode 6 so as to form a MIS-type AlGaN/GaN HEMT.

As discussed above, according to this embodiment, deterioration of characteristics caused by traps such as current collapse is reduced and a highly reliable AlGaN/GaN HEMT that has an improved pinch-off characteristic and gm and reliably achieves a normally off mode is obtained.

Note that in this embodiment, although the p-InAlN layer (p-InAlN and p$^-$-InAlN) is formed as a back barrier layer, a p-AlN layer (p-AlN and p$^-$-AlN) may be formed instead of the p-InAlN layer.

Tenth Embodiment

In a tenth embodiment, a MIS-type AlGaN/GaN HEMT is described as an example of the compound semiconductor device.

Note that the constitutional parts similar to those of AlGaN/GaN HEMT of the first embodiment are denoted by the same reference numerals and the detailed descriptions therefor are omitted to avoid redundancy.

FIGS. 20A to 21C are schematic cross-sectional views that sequentially illustrate major steps of a method for manufacturing an AlGaN/GaN HEMT of the tenth embodiment.

Figure 20A:
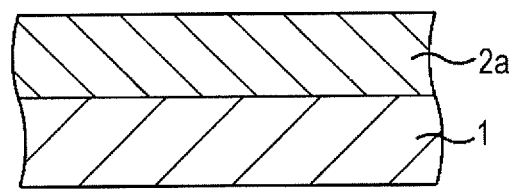
FIGS. 20A to 20C are schematic cross-sectional views that sequentially illustrate the steps of a method for manufacturing an AlGaN/GaN HEMT according to a tenth embodiment.

First, as illustrated in FIG. 20A, an i-GaN layer 2a is formed on the SiC substrate 1.

In particular, i-GaN is grown on the SiC substrate 1 to a thickness of, for example, about 3 μm by a MOVPE method so as to form the i-GaN layer 2a.

A mixed gas of a TMGa gas, which is a Ga source, and an $NH_3$ gas is used as a source gas for growing GaN. The flow rate of the TMGa gas is appropriately set, and the flow rate of the $NH_3$ gas is about 100 sccm to 10 slm. The growth pressure is about 50 Torr to 300 Torr and the growth temperature is about 1000° C. to 1200° C.

Figure 20B:
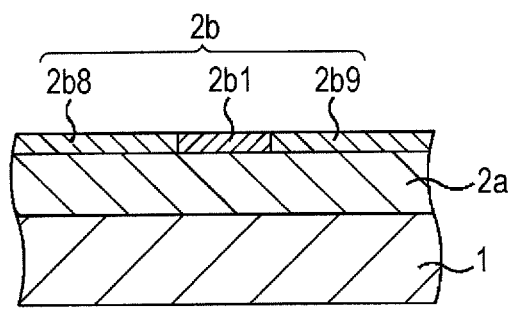

Next, as illustrated in FIG. 20B, a back barrier layer 2b is formed.

First, a resist is applied to the i-GaN layer 2a and is photolithographically processed. As a result, a resist mask that has an opening in a portion in the i-GaN layer 2a (portion that will form the p-GaN portion) aligned with and below the position where the gate electrode is to be formed and that covers the rest of the i-GaN layer 2a is formed.

A p-type impurity, e.g., Mg, C, or Zn, is ion implanted into the surface layer portion of the i-GaN layer 2a. For example, Mg is ion implanted. The p-type impurity, Mg is activated by a heat treatment at about 400° C. to 1200° C., for example, at about 800° C. As a result, a p-GaN portion 2b1 is formed in the surface layer of the i-GaN layer 2a and in a portion aligned with and below the position where the gate electrode is to be formed. The p-GaN portion 2b1 has an ionized acceptor concentration of about $1 \times 10^{16}/cm^3$ to about $1 \times 10^{21}/cm^3$, for example, about $1 \times 10^{19}/cm^3$. The resist mask is removed by an ashing process or a wet process using a particular chemical solution.

A resist is applied to the i-GaN layer 2a including the p-GaN portion 2b1 and is photolithographically processed. As a result, a resist mask that covers the p-GaN portion 2b1 and leaves other parts of the i-GaN layer 2a open is formed.

A p-type impurity, e.g., Mg, C, or Zn is ion-implanted into the surface layer portion of the i-GaN layer 2a through the resist mask. For example, Mg is ion implanted. The p-type impurity Mg is activated by a heat treatment at about 400° C. to 1200° C., for example, at about 800° C. As a result, p$^-$-GaN portions 2b8 and 2b9 are formed on either side of the p-GaN portion 2b1. The p$^-$-GaN portions 2b8 and 2b9 have the same thickness as the p-GaN portion 2b1 and have an ionized acceptor concentration lower than that of the p-GaN portion 2b1. The resist mask is removed by an ashing process or a wet process using a particular chemical solution.

A back barrier layer 2b that has the p-GaN portion 2b1 formed in a portion aligned with and below the position where the gate electrode is to be formed and the p$^-$-GaN portions 2b8 and 2b9 that are formed on either side of the p-GaN portion 2b1 is formed through these processes. In the back barrier layer 2b, the p-GaN portion 2b1 contains a larger amount of ionized acceptor than the p$^-$-GaN portions 2b8 and 2b9. That is, the p-GaN portion 2b1 is a portion with a high ionized acceptor concentration.

Figure 20C:
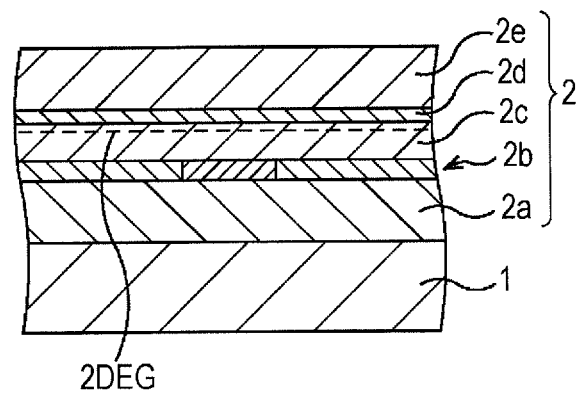

Next, as illustrated in FIG. 20C, an electron transit layer 2c, an intermediate layer 2d, and an electron donating layer 2e are sequentially formed on the back barrier layer 2b.

Compound semiconductors that respectively form the electron transit layer 2c, the intermediate layer 2d, and the electron donating layer 2e are sequentially grown on the back barrier layer 2b by a MOVPE method. The electron transit layer 2c is formed by growing i-GaN to a thickness of about 100 nm. The intermediate layer 2d is formed by growing i-AlGaN to a thickness of about 5 nm. The electron donating layer 2e is formed by growing n-AlGaN to a thickness of about 30 nm. The intermediate layer 2d may sometimes be omitted. The electron donating layer 2e may be formed of i-AlGaN.

A mixed gas of a TMGa gas which is a Ga source and an $NH_3$ gas is used as a source gas for growing GaN. A mixed gas of a TMAl gas, a TMGa gas, and an $NH_3$ gas is used as a source gas for growing AlGaN. Whether to supply TMAl gas or TMGa gas and the flow rate thereof are appropriately set in accordance with the compound semiconductor layer to be grown. The flow rate of the $NH_3$ gas, which is a common material, is about 100 sccm to 10 slm. The growth pressure is about 50 Torr to 300 Torr and the growth temperature is about 1000° C. to 1200° C.

In growing n-type AlGaN, for example, in forming the electron donating layer 2e (n-AlGaN), an n-type impurity is added to the source gas of AlGaN. In this example, a silane ($SiH_4$) gas containing Si is added to the source gas at a particular flow rate, for example, so as to dope AlGaN with Si. The Si dopant concentration is about $1 \times 10^{18}/cm^3$ to about $1 \times 10^{20}/cm^3$, for example, about $5 \times 10^{18}/cm^3$.

As a result, a compound semiconductor composite structure 2 including the sequentially stacked i-GaN layer 2a, back barrier layer 2b, electron transit layer 2c, intermediate layer 2d, and electron donating layer 2e is formed.

Figure 21A:
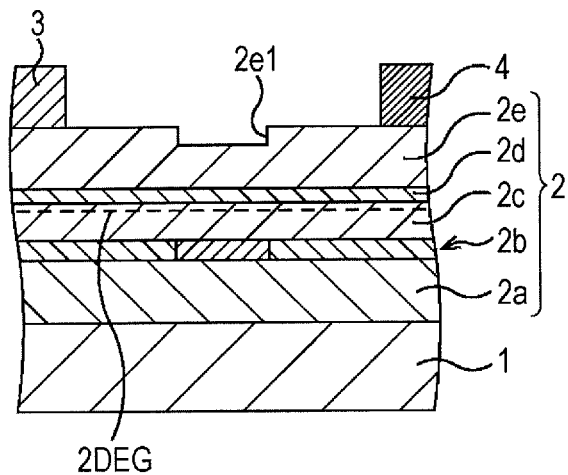
FIGS. 21A to 21C are schematic cross-sectional views that sequentially illustrate the steps of the method for manufacturing the AlGaN/GaN HEMT according to the tenth embodiment following the steps illustrated in FIGS. 20A to 20C.

After an element isolation structure is formed, an electrode recess 2e1 is formed in the electron donating layer 2e and then a source electrode 3 and a drain electrode 4 are formed as illustrated in FIG. 21A.

In particular, first, a resist is applied to the entire surface of the compound semiconductor composite structure 2 and is photolithographically processed. As a result, a resist mask having an opening that exposes the position in the electron donating layer 2e where the gate electrode is to be formed is formed.

A portion of the surface layer of the electron donating layer 2e is dry-etched through the resist mask by using, for example, a fluorine-based gas as an etching gas. As a result, the electrode recess 2e1 is formed at a position in the electron donating layer 2e where the gate electrode is to be formed. The resist mask is removed by an ashing process or a wet process that uses a particular chemical solution.

Next, a Ta/Al (Ta in the lower layer and Al in the upper layer) is used as an electrode material. In forming the electrodes, an overhang structure double layer resist suitable for a vapor deposition method or a lift-off method is used, for example. The resist is applied to the compound semiconductor composite structure 2 and a resist mask having openings at positions where the source electrode and the drain electrode are to be formed is formed. Then Ta/Al is deposited by, for example, a vapor deposition method, through the resist mask. The thickness of Ta is about 20 nm and the thickness of Al is about 200 nm. The overhang structure resist mask and Ta/Al deposited on the resist mask are removed by a lift-off method. Then the SiC substrate 1 is heat-treated in, for example, a nitrogen atmosphere at 400° C. to 1000° C., for example, at about 550° C., so as to cause the remaining Ta/Al to be in ohmic contact with the electron donating layer 2e. In the cases where the Ta/Al and the electron donating layer 2e are in ohmic contact with each other without conducting heat treatment, the heat treatment may be omitted. As a result, the source electrode 3 and the drain electrode 4 each constituted by Ta/Al are formed.

Figure 21B:
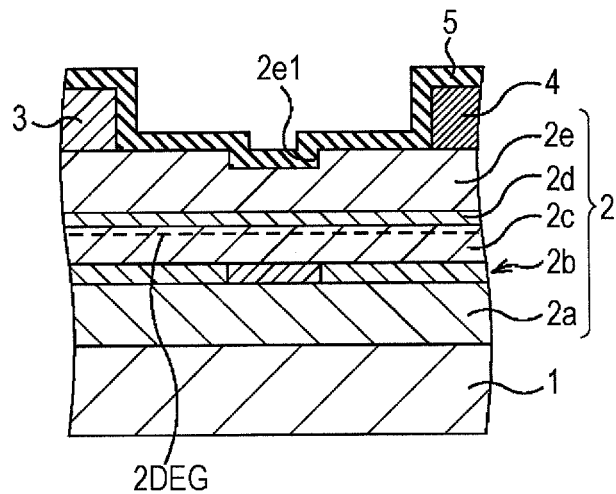

Next, as illustrated in FIG. 21B, a protective film 5 is formed on the surface of the compound semiconductor composite structure 2.

In particular, SiN is deposited over the entire surface of the compound semiconductor composite structure 2, the source electrode 3, and the drain electrode 4 to a thickness of about 2 nm to 200 nm, for example, about 20 nm, by a plasma CVD method, a sputtering method, or the like. As a result, the protective film 5 is formed. In this embodiment, the protective film 5 also functions as a gate insulating film.

Figure 21C:
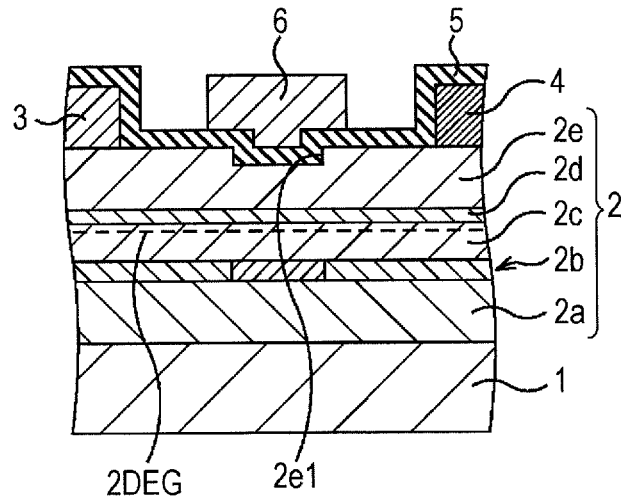

Next, as illustrated in FIG. 21C, a gate electrode 6 is formed.

Ni/Au (Ni in the lower layer and Au in the upper layer) is used as an electrode material. In forming the electrode, an overhang structure double layer resist suitable for a vapor deposition method or a lift-off method is used, for example. The resist is applied to the protective film 5 to form a resist mask that has an opening that exposes the position where the gate electrode is to be formed. Then Ni/Au is deposited by, for example, a vapor deposition method, through the resist mask. The thickness of Ni is about 30 nm and the thickness of Au is about 400 nm. The overhang structure resist mask and Ni/Au deposited on the resist mask are removed by a lift-off method. As a result, a gate electrode 6 that fills the interior of an electrode recess 2e1 with the gate metal with the protective film 5 therebetween is formed. The gate electrode 6 is formed to have an overhang shape constituted by Ni that fills the interior of the electrode recess 2e1 with the protective film 5 therebetween and extends over the protective film 5 and Au deposited on Ni.

Then electrical connection and the like are established among the source electrode 3, the drain electrode 4, and the gate electrode 6 so as to form a MIS-type AlGaN/GaN HEMT.

As discussed above, according to this embodiment, deterioration of characteristics caused by traps such as current collapse is reduced and a highly reliable AlGaN/GaN HEMT that has an improved pinch-off characteristic and gm and reliably achieves a normally off mode is obtained.

The first to tenth embodiments described above can have their features freely combined. Some of the examples thereof are given below.

For example, a gate recess structure (the structure in which the gate electrode 6 is formed in the electrode recess in the electron donating layer 11 (with the protective film 5 therebetween)) featured in the third embodiment can be employed in the InAlN/GaN HEMT of the sixth embodiment.

For example, the Schottky contact structure (the gate electrode 6 comes into Schottky contact with the compound semiconductor composite structure 2 through the opening 5a in the protective film 5) featured in the first embodiment can be employed in the InAlN/GaN HEMT of the sixth embodiment.

The structure in which the portion of the back barrier layer having a larger ionized acceptor concentration has a part that is deviated from the position below the gate electrode can be employed in the AlGaN/GaN HEMT of the ninth or tenth embodiment.

The structure in which the thickness of the back barrier layer is locally varied featured in the seventh embodiment can be employed in the AlGaN/GaN HEMT of the ninth or tenth embodiment.

The HEMTs according to the first to tenth embodiment may be applied to discrete packages.

A discrete package incorporates a chip of one of the HEMTs of the first to tenth embodiments. Examples of the discrete packages of chips of HEMTs of the first to tenth embodiments, hereinafter, referred to as HEMT chips, are described below.

Figure 22:
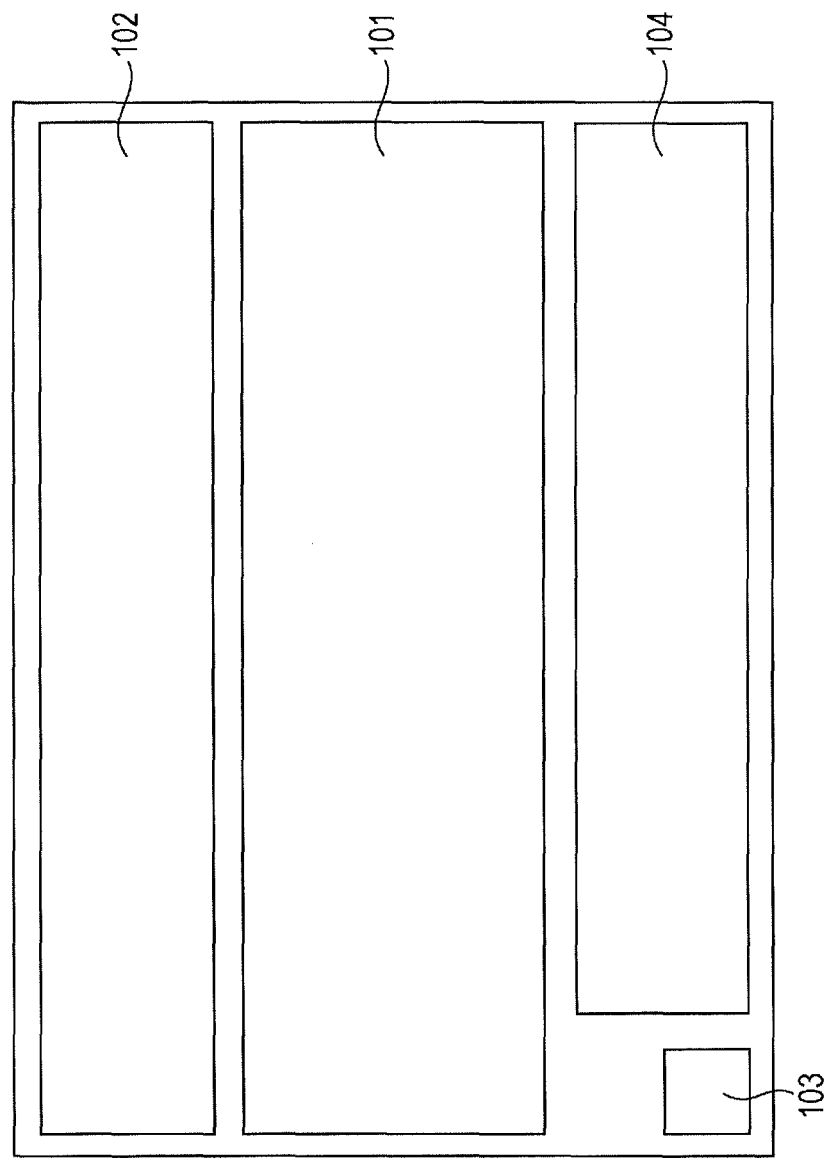
FIG. 22 is a schematic plan view illustrating a HEMT chip that includes a HEMT selected from those according to the first to tenth embodiments.

A schematic structure of a HEMT chip is illustrated in FIG. 22.

A HEMT chip 100 has a surface on which a transistor region 101 of the AlGaN/GaN HEMT described above, a drain pad 102 connected to the drain electrode, a gate pad 103 connected to the gate electrode, and a source pad 104 connected to the source electrode are formed.

Figure 23:
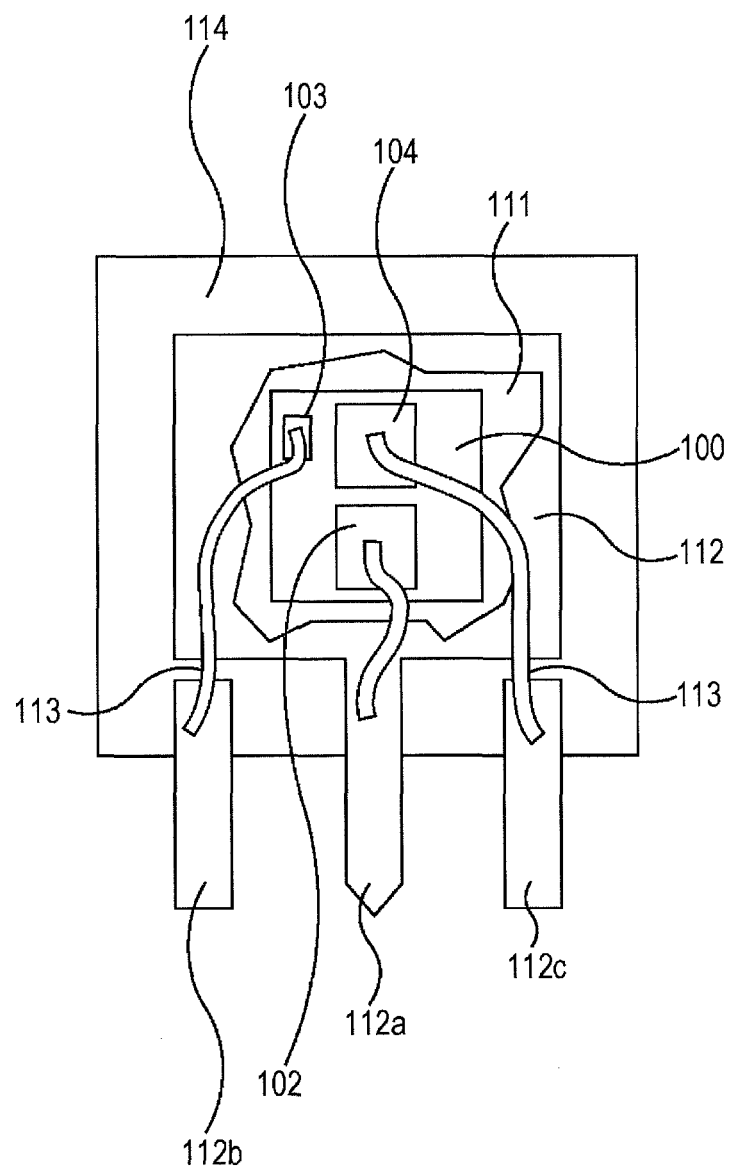
FIG. 23 is a schematic plan view illustrating a discrete package of a HEMT chip that includes a HEMT selected from those according to the first to tenth embodiments.

FIG. 23 is a schematic plan view of a discrete package.

In order to form a discrete package, first, the HEMT chip 100 is fixed to a lead frame 112 by using a die attach material 111 such as solder. The lead frame 112 is integral with a drain lead 112a. A gate lead 112b and a source lead 112c of the lead frame 112 are provided as separate components.

The drain pad 102 is electrically connected to the drain lead 112a, the gate pad 103 is electrically connected to the gate lead 112b, and the source pad 104 is electrically connected to the source lead 112c by bonding using Al wires 113.

Then the HEMT chip 100 is sealed with resin by a transfer molding method using a mold resin 114 and the lead frame 112 are detached. Thus, a discrete package is formed.

Eleventh Embodiment

In an eleventh embodiment, a power factor correction (PFC) circuit that includes a HEMT selected from those of the first to tenth embodiments is described.

Figure 24:
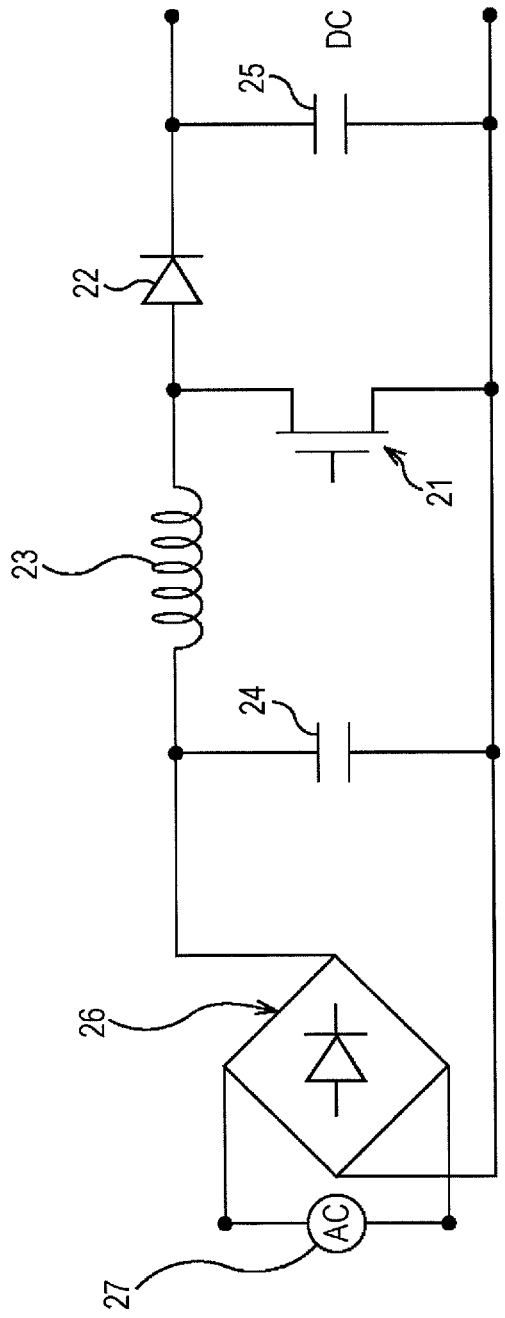
FIG. 24 is a wiring diagram illustrating a schematic configuration of a PFC circuit according to an eleventh embodiment.

FIG. 24 is a wiring diagram of a PFC circuit 20.

The PFC circuit 20 includes a switching element (transistor) 21, a diode 22, a choke coil 23, capacitors 24 and 25, a diode bridge 26, and an AC power supply (AC) 27. A HEMT selected from those of the first to tenth embodiments is used as the switching element 21.

In the PFC circuit 20, the drain electrode of the switching element 21 is connected to the anode terminal of the diode 22 and a terminal of the choke coil 23. The source electrode of the switching element 21 is connected to one terminal of the capacitor 24 and one terminal of the capacitor 25. The other terminal of the capacitor 24 is connected to the other terminal of the choke coil 23. The other terminal of the capacitor 25 is connected to the cathode terminal of the diode 22. The AC 27 is connected between the two terminals of the capacitor 24 through the diode bridge 26. A DC power source (DC) is connected between the two terminals of the capacitor 25. A PFC controller not illustrated in the drawing is connected to the switching element 21.

In this embodiment, a HEMT selected from those of the first to tenth embodiments is used in the PFC circuit 20. As a result, a highly reliable PFC circuit 20 is realized.

Twelfth Embodiment

In a twelfth embodiment, a power supply that includes a HEMT selected from those of the first to tenth embodiments is described.

Figure 25:
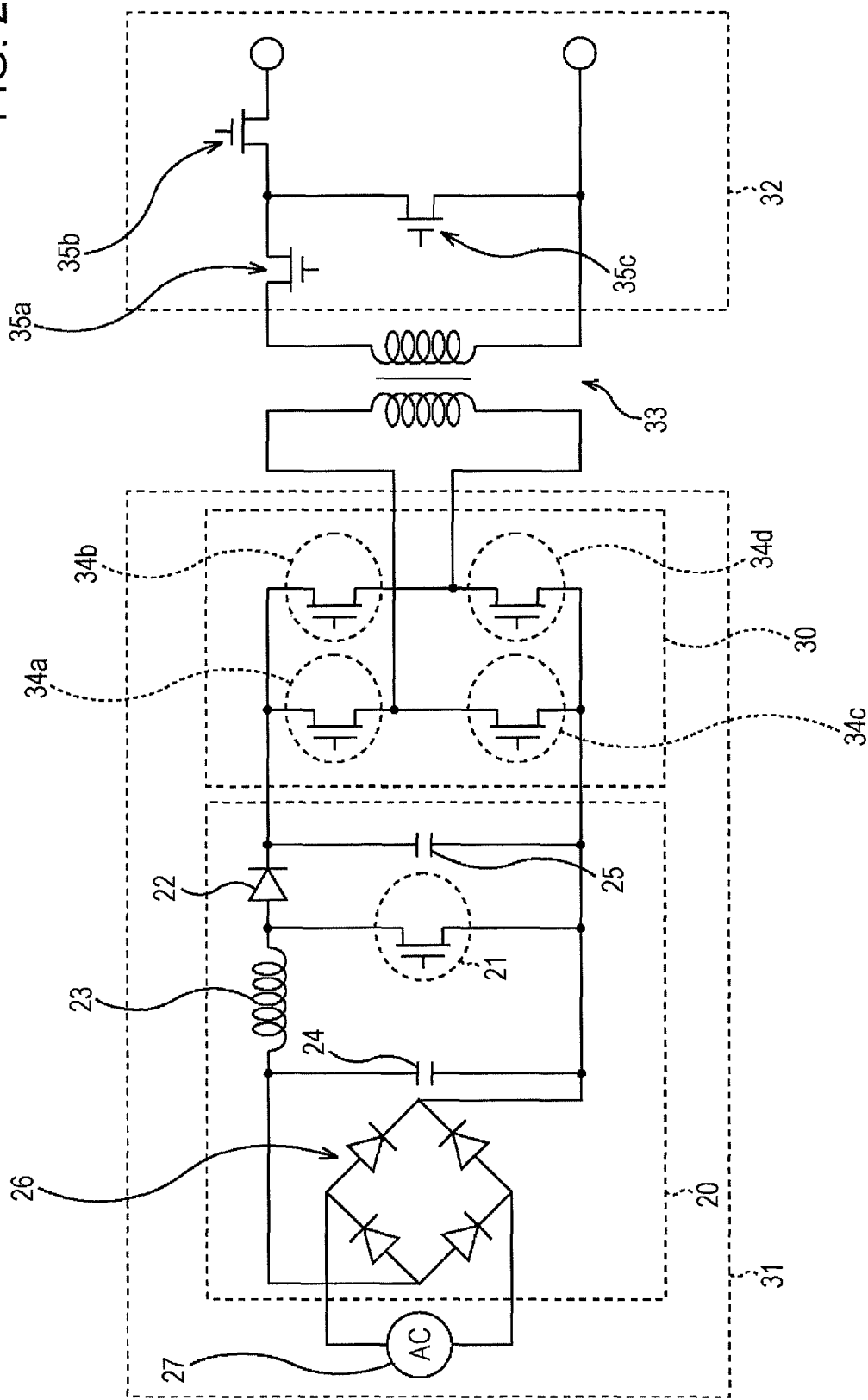
FIG. 25 is a wiring diagram illustrating a schematic configuration of a power supply according to a twelfth embodiment.

FIG. 25 is a wiring diagram illustrating a schematic structure of a power supply according to the twelfth embodiment.

The power supply of this embodiment includes a high-voltage primary circuit 31, a low-voltage secondary circuit 32, and a transformer 33 connected between the primary circuit 31 and the secondary circuit 32.

The primary circuit 31 includes the PFC circuit 20 according to the eleventh embodiment and an inverter circuit connected between the two terminals of the capacitor 25 of the PFC circuit 20, e.g., a full bridge inverter circuit 30. The full bridge inverter circuit 30 includes a plurality of (four in this embodiment) switching elements 34a, 34b, 34c, and 34d.

The secondary circuit 32 includes a plurality of (three in this embodiment) switching elements 35a, 35b, and 35c.

In this embodiment, the PFC circuit constituting the primary circuit 31 is the PFC circuit 20 according to the eleventh embodiment. The switching elements 34a, 34b, 34c, and 34d of the full bridge inverter circuit 30 are each a HEMT selected from those of the first to tenth embodiments. The switching elements 35a, 35b, and 35c of the secondary circuit 32 are each a typical MIS FET containing silicon.

In this embodiment, the PFC circuit 20 of the eleventh embodiment and the HEMTs selected from those of the first to tenth embodiments are used in the primary circuit 31, which is a high-voltage circuit. Thus, a highly reliable, high-power power supply is realized.

Thirteenth Embodiment

In a thirteenth embodiment, a high-frequency amplifier that includes a HEMT selected from those of the first to tenth embodiments is described.

Figure 26:
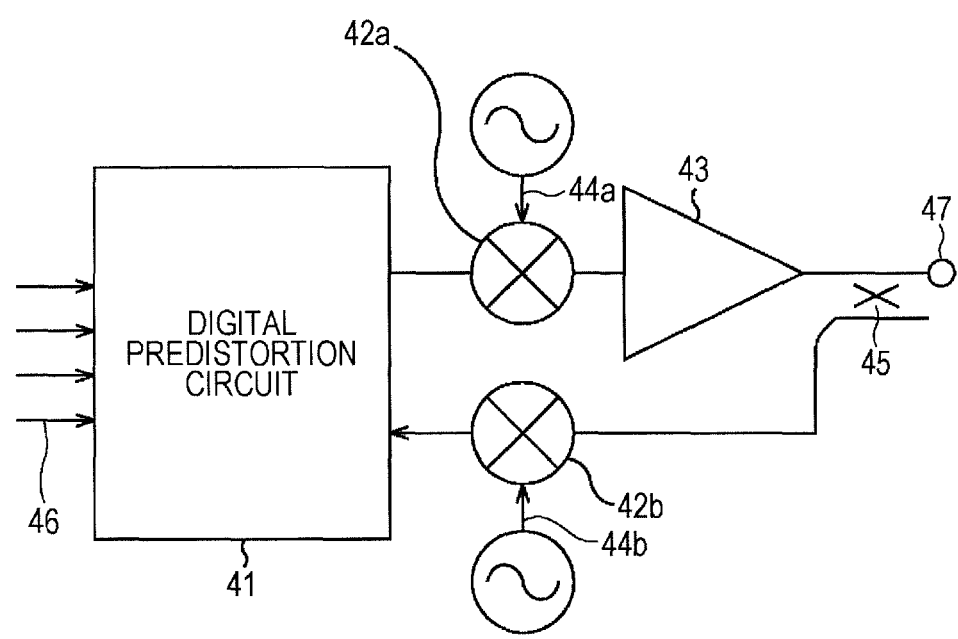
FIG. 26 is a wiring diagram illustrating a schematic configuration of a high-frequency amplifier according to a thirteenth embodiment.

FIG. 26 is a wiring diagram illustrating a schematic structure of a high-frequency amplifier according to the thirteenth embodiment.

The high-frequency amplifier of this embodiment includes a digital predistortion circuit 41, mixers 42a and 42b, and a power amplifier 43.

The digital predistortion circuit 41 compensates nonlinear distortions of input signals 46. The mixer 42a mixes the compensated input signals with an AC signal 44a. The power amplifier 43 amplifies the input signals mixed with the AC signal and outputs the amplified signals to an output terminal 47. The power amplifier 43 includes an AlGaN/GaN HEMT selected from those of the first embodiment and its modification examples. Note that according to the configuration illustrated in FIG. 26, output-terminal-47-side signals can be mixed with an AC signal 44b in the mixer 42b and transmitted to the digital predistortion circuit 41 by switching a switch 45.

In this embodiment, a HEMT selected from those of the first to tenth embodiments is used in the high-frequency amplifier. Accordingly, a high-frequency amplifier that has high reliability and withstand high voltage can be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
a compound semiconductor composite structure in which two-dimensional electron gas is generated; and
an electrode formed on the compound semiconductor composite structure,
wherein the compound semiconductor composite structure includes a p-type semiconductor layer below a first portion of the compound semiconductor structure where the two-dimensional electron gas is generated, and
the p-type semiconductor layer includes a first lateral portion containing a larger amount of an ionized acceptor than other lateral portions of the p-type semiconductor layer, the first lateral portion being located below the electrode.

2. The compound semiconductor device according to claim 1, wherein the p-type semiconductor layer is formed of a material selected from p-GaN, p-AlGaN, p-InAlN, and p-AlN.

3. The compound semiconductor device according to claim 1, wherein the other lateral portions of the p-type semiconductor layer contain an impurity for acceptor inactivation.

4. The compound semiconductor device according to claim 1, wherein the other lateral portions of the p-type semiconductor layer are thinner than the first lateral portion containing a larger amount of the ionized acceptor.

5. The compound semiconductor device according to claim 1, wherein the other lateral portions of the p-type semiconductor layer have an ionized acceptor concentration lower than that of the first lateral portion that contains a larger amount of the ionized acceptor.

6. The compound semiconductor device according to claim 1, wherein, in the p-type semiconductor layer, the first lateral portion that contains a larger amount of the ionized acceptor is deviated toward one side of the electrode.

7. The compound semiconductor device according to claim 1, wherein the electrode is in contact with the compound semiconductor composite structure.

8. The compound semiconductor device according to claim 1, wherein the electrode is disposed on the compound semiconductor composite structure with an insulating film interposed between the compound semiconductor composite structure and the electrode.

9. The compound semiconductor device according to claim 8, wherein the electrode with the insulating film is formed so as to fill a recess formed in the compound semiconductor composite structure.

10. A method for manufacturing a compound semiconductor device, the method comprising:
    forming a compound semiconductor composite structure in which two-dimensional electron gas is generated; and
    forming an electrode on the compound semiconductor composite structure,
    wherein, in forming the compound semiconductor composite structure, a p-type semiconductor layer is formed in a first portion of the compound semiconductor structure below where the two-dimensional electron gas is to be generated, and
    the p-type semiconductor layer includes a first lateral portion containing a larger amount of an ionized acceptor than other lateral portions of the p-type semiconductor layer, the first lateral portion being located below the electrode.

11. The method according to claim 10, wherein the p-type semiconductor layer is formed of a material selected from p-GaN, p-AlGaN, p-InAlN, and p-AlN.

12. The method according to claim 10, wherein the other lateral portions of the p-type semiconductor layer contain an impurity for acceptor inactivation.

13. The method according to claim 10, wherein the other lateral portions of the p-type semiconductor layer are thinner than the first lateral portion containing a larger amount of the ionized acceptor.

14. The method according to claim 10, wherein the other lateral portions of the p-type semiconductor layer have an ionized acceptor concentration lower than that of the first lateral portion that contains a larger amount of the ionized acceptor.

15. The method according to claim 10, wherein in the p-type semiconductor layer, the first lateral portion that contains a larger amount of the ionized acceptor is deviated toward one side of the electrode.

16. The method according to claim 10, wherein the electrode is in contact with the compound semiconductor composite structure.

17. The method according to claim 10, wherein the electrode is formed on the compound semiconductor composite structure with an insulating film interposed between the compound semiconductor composite structure and the electrode.

18. The method according to claim 17, wherein the electrode is formed so as to fill a recess formed in the compound semiconductor composite structure while the insulating film is disposed between the compound semiconductor composite structure and the electrode.

19. A power circuit comprising:
    a high-voltage circuit;
    a low-voltage circuit; and
    a transformer that is disposed between the high-voltage circuit and the low-voltage circuit,
    the high-voltage circuit including a transistor that includes
    a compound semiconductor composite structure in which a two-dimensional electron gas is generated, and
    an electrode formed on the compound semiconductor composite structure,
    wherein the compound semiconductor composite structure includes a p-type semiconductor layer below the two-dimensional electron gas, and
    the p-type semiconductor layer includes a first lateral portion containing a larger amount of an ionized acceptor than other lateral portions of the p-type semiconductor layer, the first lateral portion being located below the electrode.

* * * * *